United States Patent
Prokopiak et al.

(10) Patent No.: US 10,465,295 B2
(45) Date of Patent: Nov. 5, 2019

(54) JETTABLE INKS FOR SOLAR CELL AND SEMICONDUCTOR FABRICATION

(71) Applicant: Alpha Assembly Solutions Inc, Somerset, NJ (US)

(72) Inventors: Steven Prokopiak, Toms River, NJ (US); Ellen S. Tormey, Princeton Junction, NJ (US); Oscar Khaselev, Monmouth Junction, NJ (US); Michael T. Marczi, Chester, NJ (US); Bawa Singh, Marlton, NJ (US)

(73) Assignee: Alpha Assembly Solutions Inc., Somerset, NJ (US)

( * ) Notice: Subject to any disclaimer, the term of this patent is extended or adjusted under 35 U.S.C. 154(b) by 0 days.

(21) Appl. No.: 15/312,799

(22) PCT Filed: May 19, 2015

(86) PCT No.: PCT/US2015/031614
§ 371 (c)(1),
(2) Date: Nov. 21, 2016

(87) PCT Pub. No.: WO2015/179425
PCT Pub. Date: Nov. 26, 2015

(65) Prior Publication Data
US 2017/0204523 A1   Jul. 20, 2017

Related U.S. Application Data

(60) Provisional application No. 62/000,706, filed on May 20, 2014.

(51) Int. Cl.
C23F 1/16 (2006.01)
C23F 1/02 (2006.01)
(Continued)

(52) U.S. Cl.
CPC .............. *C23F 1/16* (2013.01); *C23F 1/02* (2013.01); *H01L 21/32134* (2013.01);
(Continued)

(58) Field of Classification Search
None
See application file for complete search history.

(56) References Cited

U.S. PATENT DOCUMENTS 4,160,107 A * 7/1979 Agnes ..................... C07C 67/36
560/204
4,686,021 A * 8/1987 Nakanishi .............. B41N 3/034
101/459

(Continued)

FOREIGN PATENT DOCUMENTS

CN   102403214 A   4/2012
CN   103255453 B   8/2013
(Continued)

*Primary Examiner* — Allan W. Olsen
(74) *Attorney, Agent, or Firm* — Carmody Torrance Sandak & Hennessey LLP

(57) ABSTRACT

A jettable etchant composition includes 1 to 90 wt % active ingredient, and a remainder containing any combination of the following: 10 to 90 wt % solvent, 0 to 10 wt % reducing agents, <1 to 20 wt % pickling agent, 0 to 5 wt % surfactant, and 0 to 5 wt % antifoam agent. The composition can also include a soluble compound containing at least one element which when dissolved has a higher standard electrode potential than a metal to be etched or a soluble compound containing a group IA element, and a soluble platinum group metal. An ink composition can include a group VA compound or a group IIIA compound in a solvent system formulated to be jettable on a surface at a drop volume of about 5 to about 10 picoliters and to achieve a final sheet resistance of less than about 20 Ω/α of the surface upon activation.

7 Claims, 18 Drawing Sheets

(51) Int. Cl.
   *H01L 21/3213* (2006.01)
   *H01L 31/18* (2006.01)
   *H01L 31/0224* (2006.01)
   *H01L 31/0216* (2014.01)
   *H01L 31/0236* (2006.01)

(52) U.S. Cl.
   CPC ...... *H01L 31/022425* (2013.01); *H01L 31/18* (2013.01); *H01L 31/02168* (2013.01); *H01L 31/02363* (2013.01); *H01L 31/022441* (2013.01); *H01L 31/1804* (2013.01); *Y02E 10/50* (2013.01); *Y02P 70/521* (2015.11)

(56) References Cited

U.S. PATENT DOCUMENTS

| | | | | |
|---|---|---|---|---|
| 4,948,674 | A * | 8/1990 | Herold | C03C 17/10 427/304 |
| 5,219,815 | A * | 6/1993 | Krulik | H05K 3/244 427/304 |
| 5,389,496 | A * | 2/1995 | Calvert | B05D 1/185 257/E21.174 |
| 5,431,806 | A * | 7/1995 | Suzuki | G01N 27/404 204/403.06 |
| 5,751,325 | A * | 5/1998 | Leenders | H05K 3/182 347/100 |
| 6,187,214 | B1 * | 2/2001 | Ganan-Calvo | A61M 15/0065 216/92 |
| 6,450,189 | B1 * | 9/2002 | Ganan-Calvo | B05B 7/065 137/12 |
| 8,231,811 | B2 | 7/2012 | Hazlewood | C09D 11/101 252/500 |
| 8,555,491 | B2 * | 10/2013 | Boureghda | H01L 24/29 29/832 |
| 8,597,548 | B2 * | 12/2013 | Khaselev | C09D 11/30 252/514 |
| 9,217,088 | B2 * | 12/2015 | Parashar | B22F 1/0018 |
| 2002/0069789 | A1 * | 6/2002 | Katsuragi | B41J 2/2107 106/31.27 |
| 2003/0228743 | A1 * | 12/2003 | Fukunaga | C25D 5/02 438/584 |
| 2004/0150320 | A1 * | 8/2004 | Sekiya | H01J 9/027 313/495 |
| 2004/0213912 | A1 * | 10/2004 | Murayama | H05K 3/244 427/402 |
| 2004/0254264 | A1 * | 12/2004 | Suzuki | C09D 11/40 523/160 |
| 2005/0006339 | A1 * | 1/2005 | Mardilovich | C23C 18/1601 216/39 |
| 2006/0240187 | A1 * | 10/2006 | Weidman | C23C 16/0272 427/248.1 |
| 2007/0120880 | A1 * | 5/2007 | Kawamura | C09D 11/38 347/1 |
| 2007/0135300 | A1 * | 6/2007 | Kagami | B01J 23/85 502/208 |
| 2010/0048006 | A1 | 2/2010 | Huang et al. | |
| 2010/0081264 | A1 | 4/2010 | Leung | |
| 2010/0247944 | A1 * | 9/2010 | Mleczko | B01D 67/0041 428/546 |
| 2011/0220199 | A1 * | 9/2011 | Robinson | C09D 11/38 136/256 |
| 2012/0018191 | A1 * | 1/2012 | Yoshida | C23C 18/32 174/126.2 |
| 2012/0080321 | A1 * | 4/2012 | Thomas | G04F 13/04 205/640 |
| 2012/0164780 | A1 * | 6/2012 | Brunton | H01L 31/1804 438/71 |
| 2013/0187813 | A1 * | 7/2013 | Yao | H01Q 7/00 343/700 MS |
| 2014/0005043 | A1 * | 1/2014 | Suzuki | B01J 21/066 502/333 |
| 2014/0021400 | A1 | 1/2014 | Coenjarts | |
| 2014/0091909 | A1 * | 4/2014 | Smith | H01G 4/38 340/10.1 |
| 2015/0102258 | A1 * | 4/2015 | Humle | B01J 21/063 252/194 |
| 2015/0337145 | A1 * | 11/2015 | Torrisi | C09D 11/037 428/207 |
| 2016/0376199 | A1 * | 12/2016 | Koep | C04B 35/78 507/271 |
| 2017/0130337 | A1 * | 5/2017 | Yoshida | C23C 18/1655 |

FOREIGN PATENT DOCUMENTS

| | | |
|---|---|---|
| EP | 1126048 | 2/2001 |
| EP | 2429005 | 3/2012 |
| JP | 09-316650 | 12/1997 |
| JP | 2001-181858 | 7/2001 |
| JP | 2011-503910 | 1/2011 |
| KR | 10-2012-0104565 | 9/2012 |
| WO | 2009/067483 | 5/2009 |
| WO | 2011014068 A1 | 2/2011 |
| WO | 2011/051952 | 5/2011 |

* cited by examiner

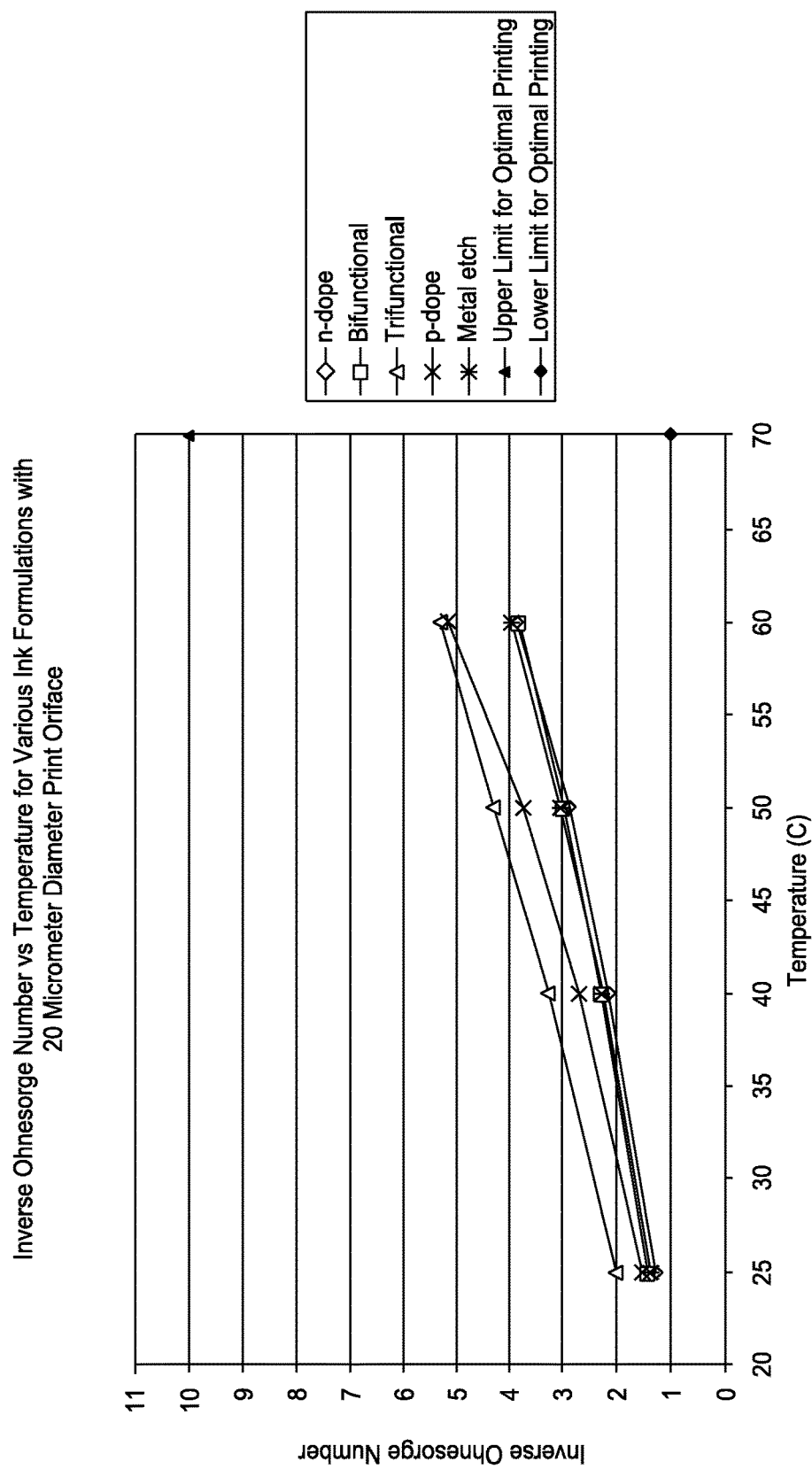
FIG. 1.1

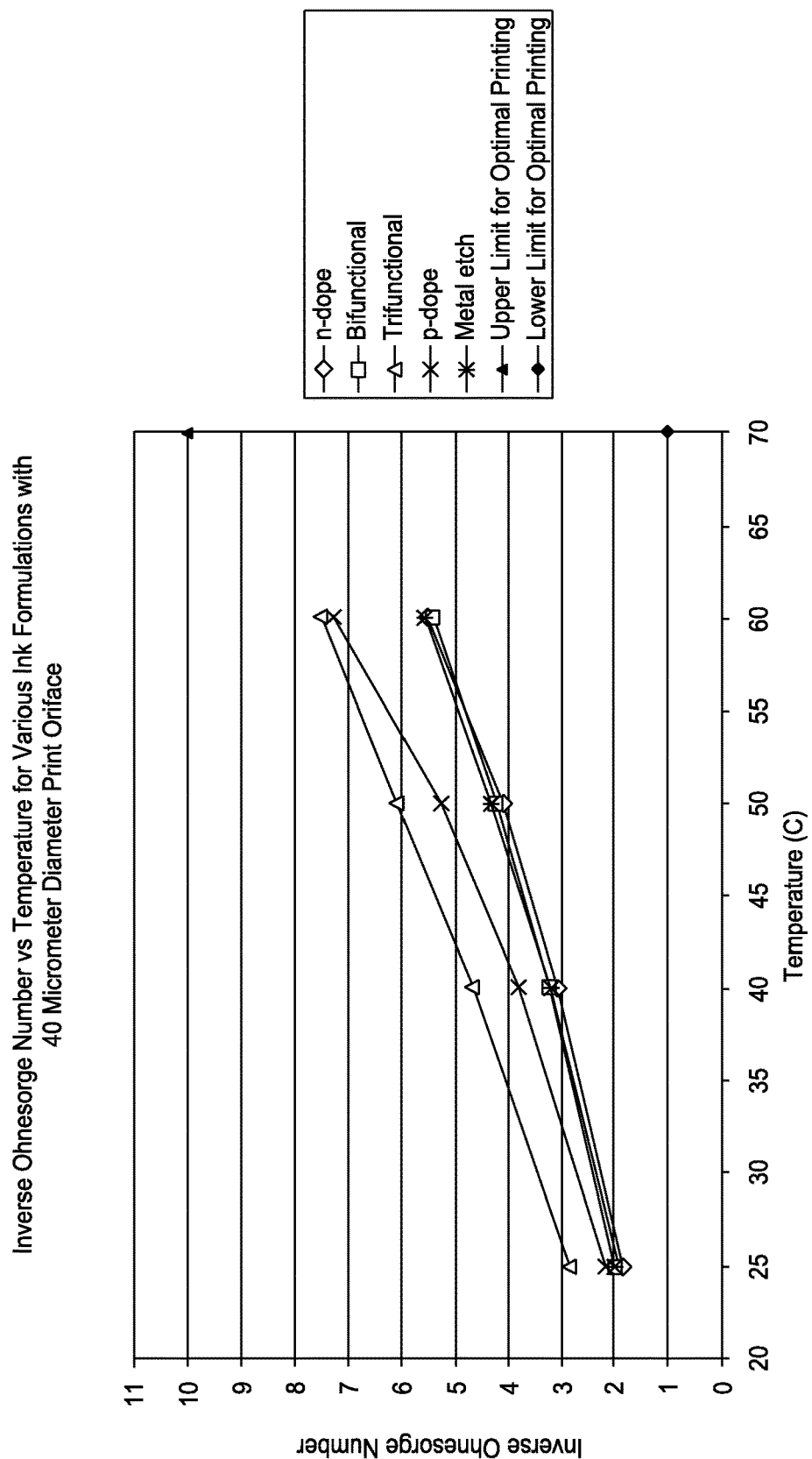
FIG. 1.2

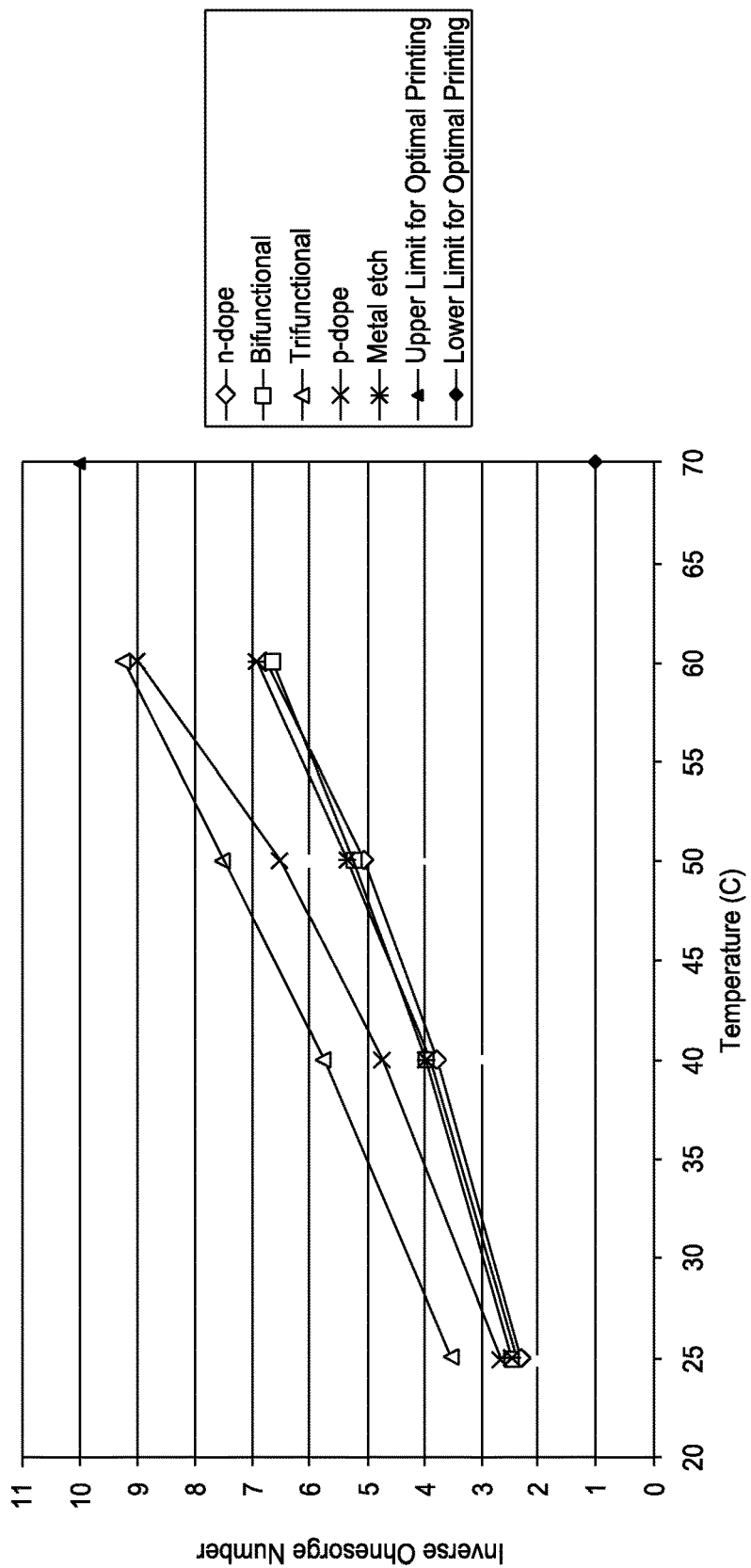
FIG. 1.3

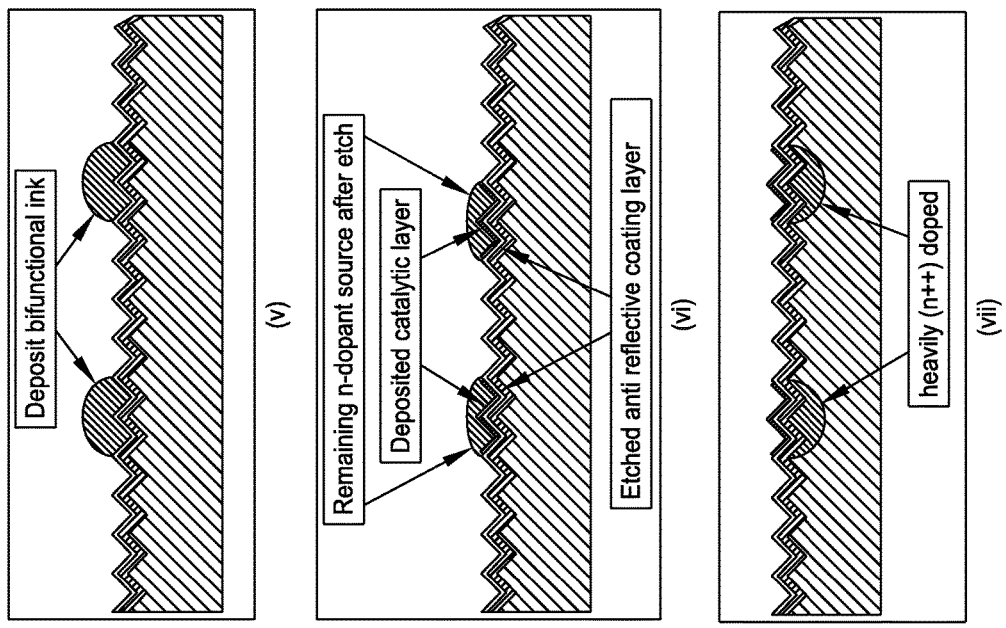
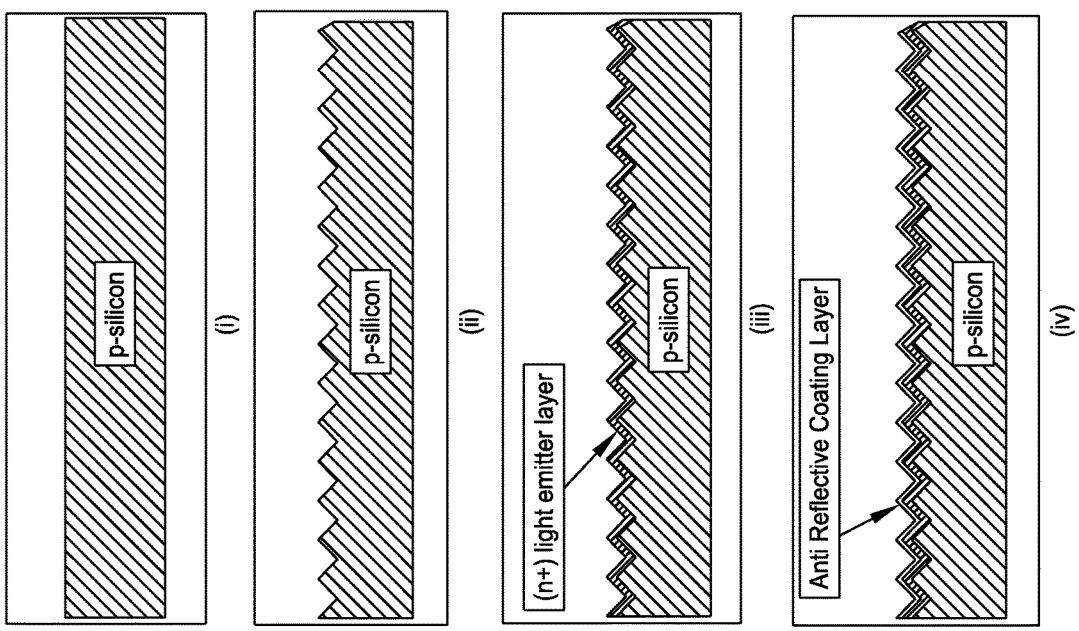
FIG. 4C

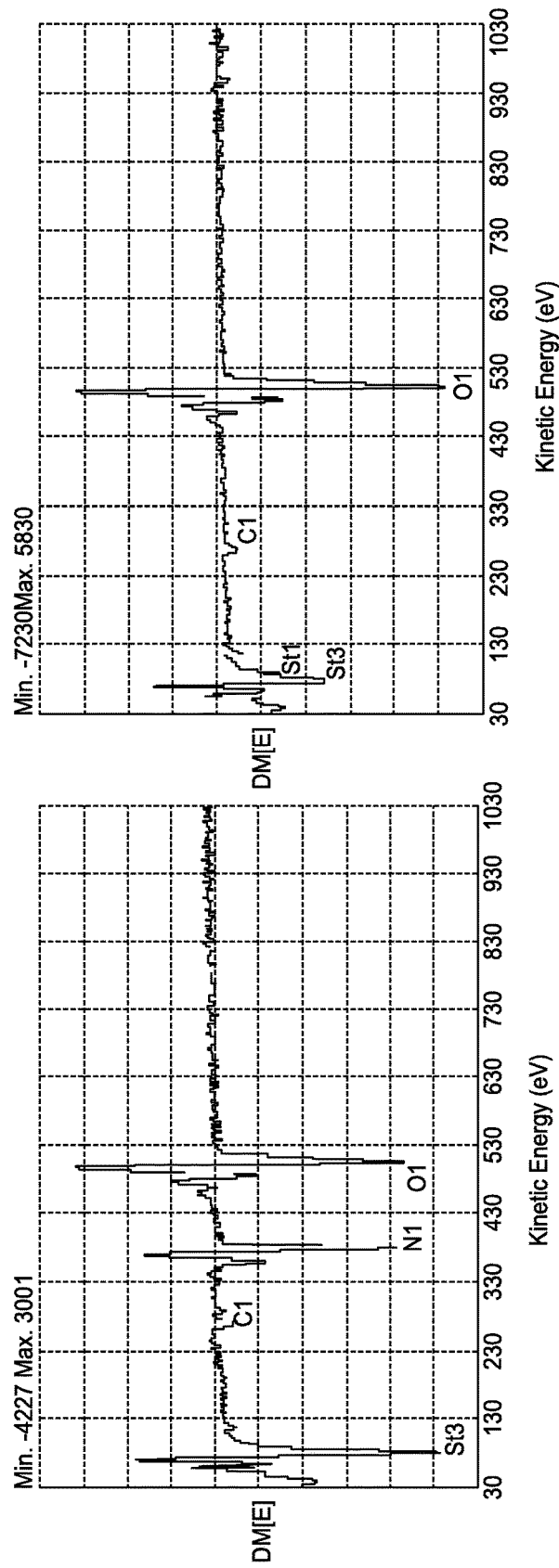

JETTABLE INKS FOR SOLAR CELL AND SEMICONDUCTOR FABRICATION

CROSS REFERENCE TO RELATED APPLICATION

This application claims priority to U.S. Provisional Application Ser. No. 62/000,706 entitled "JETTABLE INKS FOR SOLAR CELL AND SEMICONDUCTOR FABRICATION," filed on May 20, 2014, which is incorporated herein by reference in its entirety.

FIELD OF THE TECHNOLOGY

One or more aspects relate generally to semiconductor fabrication, and more particularly to jettable inks for use in semiconductor fabrication.

BACKGROUND

Printing techniques may be used to create electrical devices on various substrates. Inkjet printing is a non-contact deposition technology. Screen printing, gravure and offset lithography are also applicable to producing printed electronics.

SUMMARY

One aspect of the present disclosure is directed to a jettable etchant composition comprising 1 to 90 wt % active ingredient, and a remainder containing any combination of the following: 10 to 90 wt % solvent, 0 to 10 wt % reducing agents, <1 to 20 wt % pickling agent, 0 to 5 wt % surfactant, and 0 to 5 wt % antifoam agent. Embodiments of the composition further may include a minimum of one compound from at least one class of active ingredients with a first class active ingredient being defined as any soluble compound that will readily dissolve in the solvent and contains elements that when dissolved have a higher standard electrode potential than the metal it was deposited onto and/or soluble compound. The first class active ingredient may include one of copper (II) sulfate, gold (I) chloride, gold (III) chloride, ammonium fluoride, nitric acid, sulfuric acid, nickel (II) chloride, iron (II) chloride, iron (III) chloride, zinc (II) chloride, potassium hydroxide, sodium hydroxide, and lithium hydroxide. The first class active ingredient may range from 8.3 to 11.4 mol/liter. The composition of claim 2, wherein the active ingredient further includes a second class active ingredient defined as any soluble material having a high potential. The second class active ingredient may be a palladium or nickel containing compound. The second class active ingredient may include at least one of palladium (II) chloride, palladium (IV) chloride, palladium (II) acetate, trans-diamminedichloro-palladium(II), cis-diamminedichloro-palladium(II), tetraammine palladium hydrogen carbonate, tetraammine-palladium(II) chloride, sodium tetrachloropalladate(II), potassium tetrachloropalladate(II), palladium(II) nitrate, palladium(II) oxide, palladium(II) iodide, and diamminedinitropalladium(II). The pickling agent may be defined as any chemical or chemical mixtures which readily remove the metal passivation layer. The pickling agent may include at least one of hydrochloric, sulfuric, nitric, and phosphoric acids.

Another aspect of the present disclosure is directed to a jettable etchant composition for silver, aluminum or nickel vanadium. The composition comprises a soluble compound containing at least one element which when dissolved has a higher standard electrode potential than a metal to be etched or a soluble compound containing a group IA element, and a soluble platinum group metal. Embodiments of the composition further may include an etchant for silver, aluminum or nickel vanadium.

Yet another aspect of the disclosure is directed to an ink composition comprising a group VA compound or a group IIIA compound in a solvent system formulated to be jettable on a surface at a drop volume of about 5 to about 10 picoliters and to achieve a final sheet resistance of less than about 20Ω/□ of the surface upon activation. Embodiments of the composition further may include the group VA compound including one of phosphoric acid and phosphorous pentoxide. The group IIIA compound may include one of boron, aluminum, gallium and indium. The solvent system may include at least one alcohol, diol and/or acetate. The acetate may include at least one of methyl-, ethyl-, proply-, butyl-, pentyl-, hexyl-, heptyl-, and octyl-acetate. The composition may be formulated to simultaneously catalyze a surface for electroless nickel deposition, reduce the final sheet resistance of the surface to less than about 20Ω/□, and to etch at least a portion of the surface layer.

The present disclosure is further directed to a method of manufacturing a semiconductor or photovoltaic device. In one embodiment, the method comprises: providing a substrate including a surface layer; inkjet printing a composition having an activation ingredient on at least a portion of the surface layer; and activating the composition to promote at least one of etching or doping of the surface layer. Embodiments of the method further may include the composition having 1 to 90 wt % active ingredient, and a remainder containing any combination of the following: 10 to 90 wt % solvent, 0 to 10 wt % reducing agents, <1 to 20 wt % pickling agent, 0 to 5 wt % surfactant, and 0 to 5 wt % antifoam agent. The active ingredient may include a minimum of one compound from at least one class of active ingredients with a first class active ingredient being defined as any soluble compound that will readily dissolve in the solvent and contains elements that when dissolved have a higher standard electrode potential than the metal it was deposited onto and/or soluble compound. The first class active ingredient may include one of copper (II) sulfate, gold (I) chloride, gold (III) chloride, ammonium fluoride, nitric acid, sulfuric acid, nickel (II) chloride, iron (II) chloride, iron (III) chloride, zinc (II) chloride, potassium hydroxide, sodium hydroxide, and lithium hydroxide. The first class active ingredient may range from 8.3 to 11.4 mol/liter. The active ingredient further may include a second class active ingredient defined as any soluble material having a high potential. The second class active ingredient may be a palladium or nickel containing compound. The second class active ingredient may include at least one of palladium (II) chloride, palladium (IV) chloride, palladium (II) acetate, trans-diamminedichloro-palladium(II), cis-diamminedichloro-palladium(II), tetraammine palladium hydrogen carbonate, tetraammine-palladium(II) chloride, sodium tetrachloropalladate(II), potassium tetrachloropalladate(II), palladium(II) nitrate, palladium(II) oxide, palladium(II) iodide, and diamminedinitropalladium(II). The pickling agent may be defined as any chemical or chemical mixtures which readily remove the metal passivation layer. The pickling agent may include at least one of hydrochloric, sulfuric, nitric, and phosphoric acids. The surface layer may comprise an anti-reflective coating. The method may be used to produce a device, such as a photovoltaic cell or printed electronics. The device may have a final sheet resistance of the photovoltaic cell of less than about 20Ω/□. The device may have an etched line of less than about 50 microns in width.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1.1 is a graph showing inverse Ohnesorge number versus temperature for various ink formations with 20 micrometer diameter print orifice;

FIG. 1.2 is a graph showing inverse Ohnesorge number versus temperature for various ink formations with 40 micrometer diameter print orifice;

FIG. 1.3 is a graph showing inverse Ohnesorge number versus temperature for various ink formations with 60 micrometer diameter print orifice;

FIGS. 6A and 6B are graphs showing nitrogen in a non-etched region of a wafer (FIG. 6A) and no nitrogen along the etched line (FIG. 6B);

DETAILED DESCRIPTION

Figure 2:
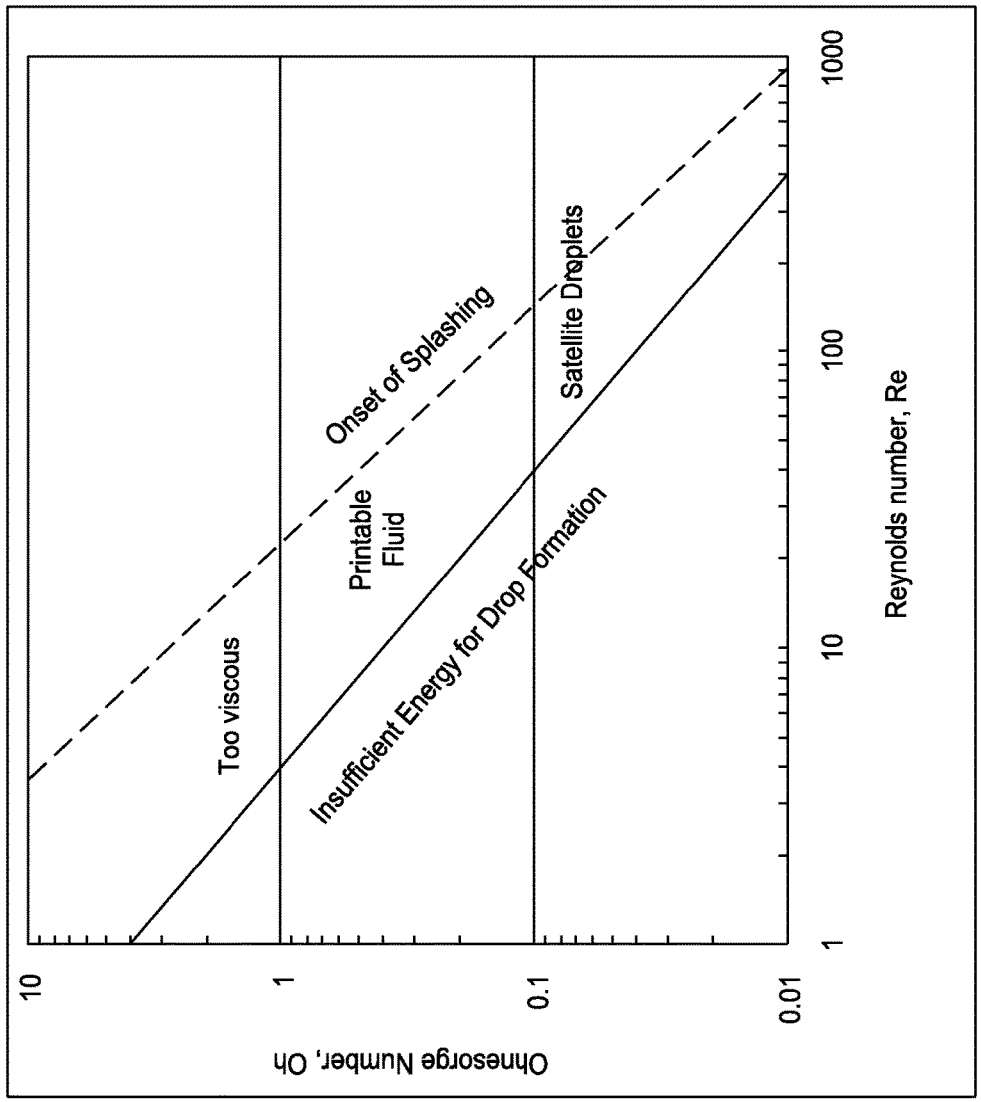
FIG. 2 is a graph showing Ohnesorge number versus Reynolds number.

In accordance with one or more embodiments, ink formulations may be jettable and generally printable via a contactless approach, such as with inkjet technology. Inkjet printing of such formulations may facilitate various functions, including etching, doping and deposition of catalyst and/or dielectric layers. At least some disclosed ink formulations may be bifunctional, trifunctional or multifunctional. Inks in accordance with one or more embodiments may be used in the manufacture of various electronics. The compositions and methods may be used in the manufacture of articles including MEMS devices, photovoltaic devices, display devices and panels, solar cell panels, electrochemical cells, printed circuits, antennas, shielding devices, microwave circuits, control modules, and information storage devices. In at least some embodiments, disclosed inks may be used in the manufacture of various printed electronics. One or more embodiments may have particular applicability in photovoltaic cell applications. Ink compositions may be deposited onto various surfaces, such as those associated with semiconductors and photovoltaics.

Various substrates and surface materials may be used. Non-limiting substrates may include glass, ceramic, metal or plastic and may be rigid or flexible. In some non-limiting embodiments, substrates may be multicrystalline silicon, monocrystalline silicon, silicon, silcon nitride or oxysilicon nitride. Substrates may be textured or nontextured. Non-limiting surface materials may include a metal such as gold, silver, palladium, platinum, copper, aluminum and nickel.

In accordance with one or more embodiments, a semiconductor such as a solar cell may include one or more functional layers. These may include a surface passivation layer and/or an anti-reflective coating. Surface passivation layers for semiconductors often include silicon nitride, silicon dioxide, aluminum oxide or stacks of alternating layers thereof. Other surface passivation layers may include amorphous silicon, silicon oxide and aluminum oxide. The layers may be deposited on a semiconductor by various techniques including chemical vapor deposition (CVD), plasma-enhanced CVD, sputtering and thermal treatments such as dry and wet oxidation. Anti-reflective coatings may increase the conversion efficiency of solar cells and may include silicon nitride, silicone dioxide and titanium oxide. In accordance with one or more embodiments, jettable inks may facilitate solar cell fabrication. The inks may enable the integration of various benefits associated with inkjet technology into solar cell production.

In at least some embodiments, functionality and printability may be combined in various ink formulations. A single ink may be multifunctional thus reducing processes steps. In some embodiments, a single process step may be used. Jettable inks in accordance with one or more embodiments may function as a metal etchant. At least certain jettable inks may be bifunctional or trifunctional. Bifunctional inks may facilitate etching as well as doping. In some non-limiting embodiments, a bifunctional p-dope may facilitate p-doping and catalyze a surface for nickel plating. In other non-limiting embodiments, a bifunctional metal etch may facilitate metal etching and may catalyze a surface for nickel plating. An ink may be a single-step etching and n-dopant inkjet formula. Trifunctional inks may facilitate deposition in addition to etching and doping as discussed further herein. Trifunctional inks may replace silver with copper which may lead to significant cost reductions. In accordance with one or more embodiments, additive, contactless inkjet deposition technology may be applied to photovoltaics. Ink formulations disclosed herein including p dopants, n dopants, dielectric, silver conductive metallic inks, catalysts for plating and etchants may provide direct pattern printing, etching and/or doping.

Enhanced production yield and increased cell efficiency of up to or greater than 0.5% may be achieved compared to conventional screen printing techniques. For example, disclosed formulations may etch anti-reflective material on photovoltaic cells in the valleys and peaks of the silicon active layer, ensuring minimal resistivity of the contact to the silicon. In some embodiments, very narrow feature line widths may be etched, such as less than 100 microns. In at least some embodiments, line widths of less than 50 microns may be achieved. Conductive metal inks may also be jetted to digitally produce contact lines with thicknesses of two or three times finer than can conventionally be produced with pastes and rotary screen printing. The reduced metal contact line width may reduce shadowing on the active layer enabling increased cell efficiency. The high resolution processes may save process steps, speed setup time, eliminate waste and reduce cost through automation. Contactless printing may enable inkjet printing for thin, sensitive substrates. High selectivity in etching silicon nitride may be achieved in comparison with laser printing. Lines and holes can be produced without the damage and defects to a textured silicon structure conventionally associated with laser printing. Precise amounts of material may be accurately deposited preventing waste.

In accordance with one or more embodiments, a non-contact process involving use of the disclosed jettable inks may result in up to about a tenfold reduction in wafer scrap compared to the use of contact selective emitter processes such as screen etching or laser etching. Scrap rates may be reduced in some embodiments because off-contact printing processes may minimize stress to brittle silicon and will accommodate industrial use of thinner silicon substrates. Silicon thickness reduction, combined with the added efficiency of a single-step process can lead to cost savings of up to about 15% or higher compared to alternative selective emitter approaches. For example, use of materials other than silver may be facilitated in accordance one certain embodiments leading to cost savings. Combining the etching and doping processes also may eliminate the need for very precise alignment of etchant and dopant in separate processes. Catalysts for electroless plating may also be deposited in some embodiments.

In accordance with one or more embodiments, jettable inks may enable production of conductive lines on cells with much smaller line widths than the current state of the art for thick film inks which is approximately 100 microns on average. In some non-limiting embodiments, conductive lines produced by jetting the disclosed etchant/dopant inks followed by plating may be less than about 100 microns wide. In some embodiments, line width may be less than about 75 microns, for example, less than about 50 microns wide. In at least one non-limiting embodiment, line width may be less than about 35 microns wide.

In accordance with one or more embodiments, one or more functional layers may be selectively etched to form useful patterns on the substrate. Etching may allow for design, the building of various structural features, the defining of certain electrical properties, or the connection of components. The processes may remove thin coatings or layers of materials on the surface of a substrate, such as but not limited to tenths to several microns in thickness. Etching may generally be substantially residue free in accordance with one or more embodiments. In some embodiments, disclosed processes do not require masking and the etchant is applied only to those portions where removal is desired. In other embodiments, masking may be used in conjunction with other processes.

In accordance with one or more embodiments, defined regions may be selectively doped via direct patterning. Dopant compositions may create regions, for example, in monocrystalline and polycrystalline silicon wafers. Penetration depth of dopant is generally controlled through parameters such as diffusion time and diffusion temperature. Final sheet resistance values may be directly related to doping levels. In some non-limiting embodiments, when starting with a monocrystalline silicon wafer having an initial sheet resistance of about 75Ω/□, final sheet resistances of less than about 15Ω/□ can be achieved with phosphorous containing inkjet formulations (n-dope) and less than about 40Ω/□ with boron containing inkjet formulations (p-dope). In some embodiments, a selective emitter may be formed with a final sheet resistance of less than about 20 Ω/□.

In accordance with one or more embodiments, an etching and/or doping composition may be inkjet printed. Resolution is generally influenced by the diameter of droplets jetted from a printhead as well as by surface interactions between the droplet and the surface onto which it is jetted. Low consumption of process chemicals may be achieved with contactless, local deposition. Various layouts may be printed via computer-aided design (CAD). In accordance with one or more embodiments, the fluid properties of the ink composition must be generally suitable for printing and jetting, including its surface tension, fluid density, viscosity and viscoelasticity. In some embodiments, surface tension may be in a range of about 30 to about 40 dynes/cm. In some embodiments, fluid density may be in a range of about 0.8 to about 1.5 kg/m3. In some embodiments, viscosity may be in a range of about 7 to about 15 cP at about 40° C. In some non-limiting embodiments, these parameters regarding fluid properties may be related to the inverse Ohnesorge number, with some preferred values in the range of about 1 to about 10. Uniform thickness is also achievable.

In accordance with one or more embodiments, a jettable ink may serve as one or more of a catalyst, dopant, etchant and dialectric for generation of photovoltaic cells. In some embodiments, a jettable ink may be trifunctional to facilitate catalyst, dope and etch in a one step one pass solution. Non-limiting trifunctional inks may simultaneously catalyze printed areas for electroless nickel deposition, reduce final sheet resistance to less than about 20Ω/□ and etch one or more various layers with little or no residue. Fine line capabilities, such as less than about 60 μm may be achieved. Silver contacts may be replaced with copper to reduce cost. Selective emitter structures may be produced. In some non-limiting embodiments, a trifunctional ink may have a pH of about 1.2 at 21° C., a specific gravity of about 1.07 g/cc at 77° F., a viscosity of about 12-14 cps at 40° C., 100 rpm, and a surface tension of about 35-37 dynes/cm at room temperature.

In accordance with one or more embodiments, jettable inks may facilitate various metal etch processes. Fine features in metallization layers may be etched without the use of a mask. For example, structures may be etched in aluminum and nickel vanadium without compromising underlying passivation layers. Such etchants exhibit excellent selectivity with fine line capabilities and line edge definition. Jettable etchant inks may also be processed at low temperatures, such as less than about 80° C. In some non-limiting embodiments, an etchant ink may have a pH of about 0.7 at 21° C., a specific gravity of about 1.48 g/cc at 77° F., a viscosity of about 12-14 cps at 40° C., 100 rpm, and a surface tension of about 35-37 dynes/cm at room temperature.

In accordance with one or more embodiments, jettable inks may be dielectric inks to allow selective diffusion or etch for producing back contact cells or selective emitters. Such barrier inks may be effective in a single pass with excellent adhesion. Continuous films may be formed substantially free of pin holes or cracks. Dielectric inks may be processed at low temperatures, such as less than about 200° C. In some non-limiting embodiments, a dielectric ink may have a pH of about 3.7 at 22° C., a specific gravity of about 1.00 g/cc at 77° F., a viscosity of about 12-14 cps at 40° C., 100 rpm, and a surface tension of about 35-37 dynes/cm at room temperature.

In accordance with one or more embodiments, a jettable ink may be a dopant ink, such as a p-dopant or an n-dopant. Desired concentrations may be delivered in single pass printing in view of their printability and droplet formation to enable the manufacture of back contact cells and selective emitters. Fine lines and desired line definition, for example, less than about 20 μm, may be achieved. A low sheet resistance after doping may be achieved, for example, less than about 20Ω/□. In some non-limiting embodiments, an n-dopant ink may have a pH of about 0.6 at 21° C., a specific gravity of about 1.03 g/cc at 77° F., a viscosity of about 12-14 cps at 40° C., 100 rpm, and a surface tension of about 35-40 dynes/cm at room temperature. In some non-limiting embodiments, a p-dopant ink may have a pH of about 3.4 at 22° C., a specific gravity of about 1.07 g/cc at 77° F., a viscosity of about 10-12 cps at 40° C., 100 rpm, and a surface tension of about 35-40 dynes/cm at room temperature.

In accordance with one or more embodiments, controlled fluid delivery may be impacted by the ability of a fluid to be printed. The jettability of a fluid is directly related to the print fluid's dynamic properties. The Ohnesorge number is generally a dimensionless comparison quantity comparing the viscous to inertial and surface tension forces. The Ohnesorge number (Oh) may be used to predict a fluid's jettability and may be represented as:

$$Oh = \mu/\sqrt{(\rho \sigma \alpha)}$$

Where $\mu$ is the viscosity of the fluid, $\rho$ is the density of the fluid, $\sigma$ is the surface tension of the fluid, and $\alpha$ is the drop diameter of the fluid (determined by the printing orifice diameter) at jetting temperature.

Inverse Ohnesorge numbers ($Oh^{-1}$) of between 1 and 10 have been found to be optimal for printing stable drops. See McKinley, Gareth H., Dept. of Mech. E. MIT and Renardy, Michael, Dept. of Math. VA Tech., Wolfgang von Ohnesorge (Aug. 24, 2011).

Listed in Tables 1.1 to 1.3, and represented graphically in FIGS. 1.1 to 1.3, calculated inverse Ohnesorge numbers for various inkjet formulations in accordance with one or more embodiments at typical printing temperatures of 25, 40, 50, and 60° C. and print orifice diameters of 20, 40 and 60 μm are depicted.

TABLE 1.1

| Ink Type | Printing Orifice Diameter [um] | Density [kg/m3] | Surface Tension [N/m] | Inverse Ohnesorge Number @25 C. | Inverse Ohnesorge Number @40 C. | Inverse Ohnesorge Number @50 C. | Inverse Ohnesorge Number @60 C. |
|---|---|---|---|---|---|---|---|
| n-dope | 20 | 1105 | 41294 | 1.32 | 2.17 | 2.90 | 3.90 |
| Bifunctional | 20 | 1068 | 39732 | 1.41 | 2.28 | 2.99 | 3.82 |
| Trifunctional | 20 | 1031 | 40510 | 2.02 | 3.30 | 4.32 | 5.33 |
| p-dope | 20 | 1045 | 43222 | 1.53 | 2.71 | 3.73 | 5.16 |
| Metal etch | 20 | 1047 | 39026 | 1.36 | 2.25 | 3.06 | 3.95 |

TABLE 1.2

| Ink Type | Printing Orifice Diameter [um] | Density [kg/m3] | Surface Tension [N/m] | Inverse Ohnesorge Number @25 C. | Inverse Ohnesorge Number @40 C. | Inverse Ohnesorge Number @ 50 C. | Inverse Ohnesorge Number @60 C. |
|---|---|---|---|---|---|---|---|
| n-dope | 40 | 1105 | 41294 | 1.87 | 3.07 | 4.11 | 5.52 |
| Bifunctional | 40 | 1068 | 39732 | 1.99 | 3.22 | 4.23 | 5.41 |
| Trifunctional | 40 | 1031 | 40510 | 2.86 | 4.66 | 6.11 | 7.54 |
| p-dope | 40 | 1045 | 43222 | 2.16 | 3.83 | 5.27 | 7.30 |
| Metal etch | 40 | 1047 | 39026 | 1.92 | 3.18 | 4.33 | 5.59 |

TABLE 1.3

| Ink Type | Printing Orifice Diameter [um] | Density [kg/m3] | Surface Tension [N/m] | Inverse Ohnesorge Number @25 C. | Inverse Ohnesorge Number @40 C. | Inverse Ohnesorge Number @ 50 C. | Inverse Ohnesorge Number @60 C. |
|---|---|---|---|---|---|---|---|
| n-dope | 60 | 1105 | 41294 | 2.29 | 3.76 | 5.03 | 6.76 |
| Bifunctional | 60 | 1068 | 39732 | 2.44 | 3.94 | 5.19 | 6.62 |
| Trifunctional | 60 | 1031 | 40510 | 3.50 | 5.71 | 7.48 | 9.23 |
| p-dope | 60 | 1045 | 43222 | 2.64 | 4.69 | 6.46 | 8.94 |
| Metal etch | 60 | 1047 | 39026 | 2.36 | 3.90 | 5.30 | 6.85 |

Figure 3:
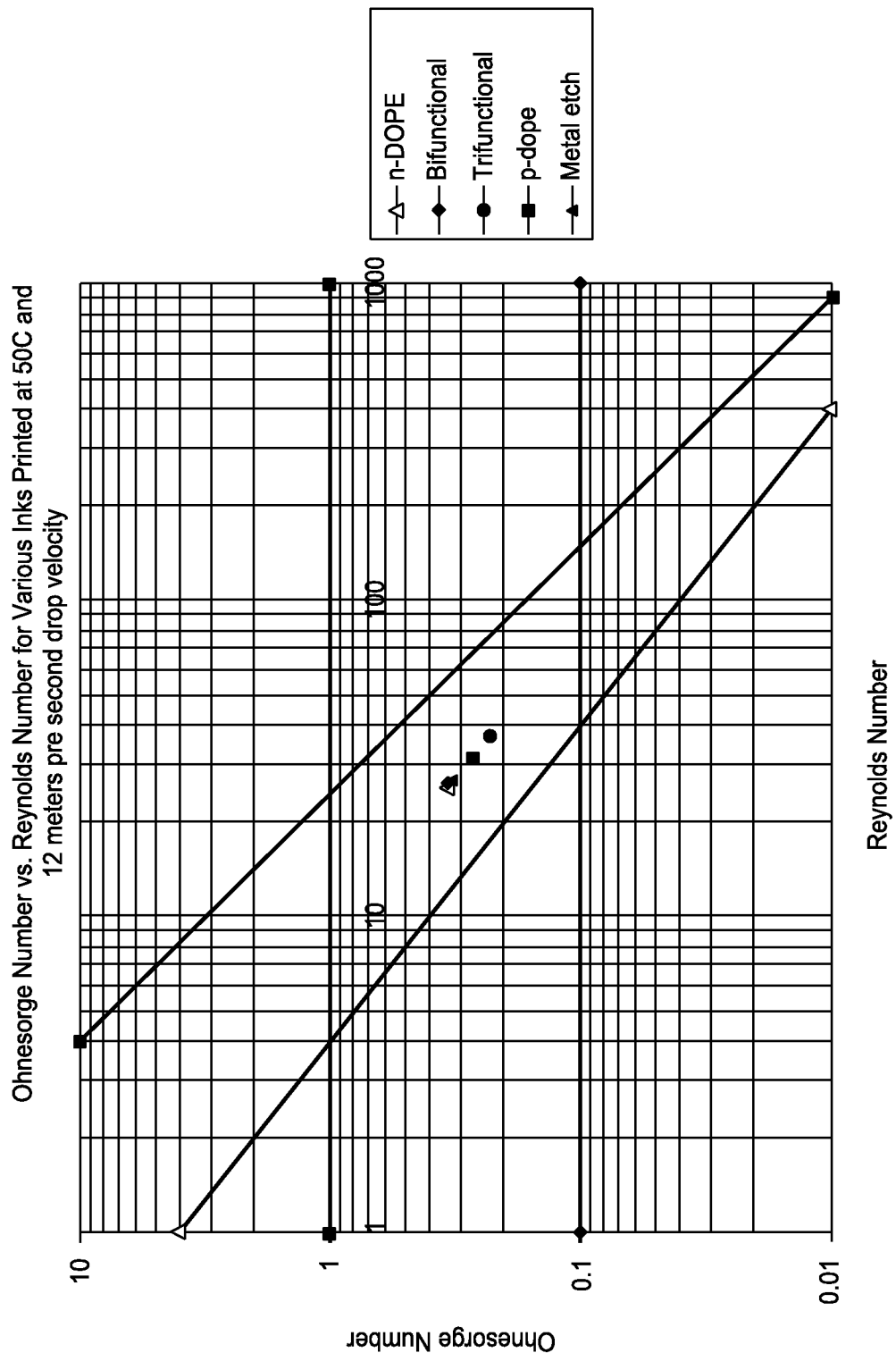
FIG. 3 is a graph showing Ohnesorge number versus Reynolds number for various inks printed at 50° C. and 12 meters per second drop velocity.

The Ohnesorge number is plotted vs. Reynolds number in FIG. 2. See McKinley, Gareth H., Dept. of Mech. E. MIT and Renardy, Michael, Dept. of Math. VA Tech., Wolfgang von Ohnesorge (Aug. 24, 2011). This schematic demonstrates the operating regime for stable drop formation. In FIG. 3, the Ohnesorge vs. Reynolds number has been plotted for various inkjet formulations at 50° C. with a drop velocity of 12 m/s and a 20 micrometer printhead orifice diameter. When FIG. 3 is compared to FIG. 2, all described inkjet formulations are within the bounds of a "printable fluid."

In some embodiments, the ink composition may include a solvent containing an etchant that can remove material from a surface on which the composition is deposited. The ink composition can alternatively contain a modifier that can transform the physical properties of a substrate surface. Compounds such as surfactants, binders, carrier solvents or other compounds may be added to adjust surface tension, enhance wetting, and promote etching rate and film drying. Thus, the composition may include materials to aid in the formulation of the composition, the printing of the composition or their performance in end use applications.

In accordance with one or more embodiments, temperature of an inkjet process may be dependent on the solvent system. Solvents or solvent systems should generally be compatible with the etchants or modifiers. Solvents should have sufficiently volatility that they will evaporate at relatively low levels of heat at atmospheric pressure but not so volatile that the ink rapidly dries at normal room temperatures during the inkjetting process. In some embodiments, solvents should generally have boiling points less than about 175° C. and relatively low evaporation rates.

A suite of inkjettable fluids and their associated processing parameters for the production of selective emitter and/or back contact type solar cells in both mono and poly crystalline silicon is disclosed herein.

In accordance with one or more embodiments, a printable ink may function as an n-dope. The n-dope is typically printed upon a "bare" (non-silicon nitride or oxynitride containing) mono or poly crystalline silicon substrate. After printing, the substrates can be first dried at temperatures of less than about 175° C. or directly placed into a diffusion furnace at temperatures of about 800° C. to greater than about 1000° C. The diffusion time depends on the chosen diffusion temperature, initial dopant concentration (sheet resistance) of the n layer and final dopant concentration (sheet resistance) required in the n+ region.

Figure 4A:
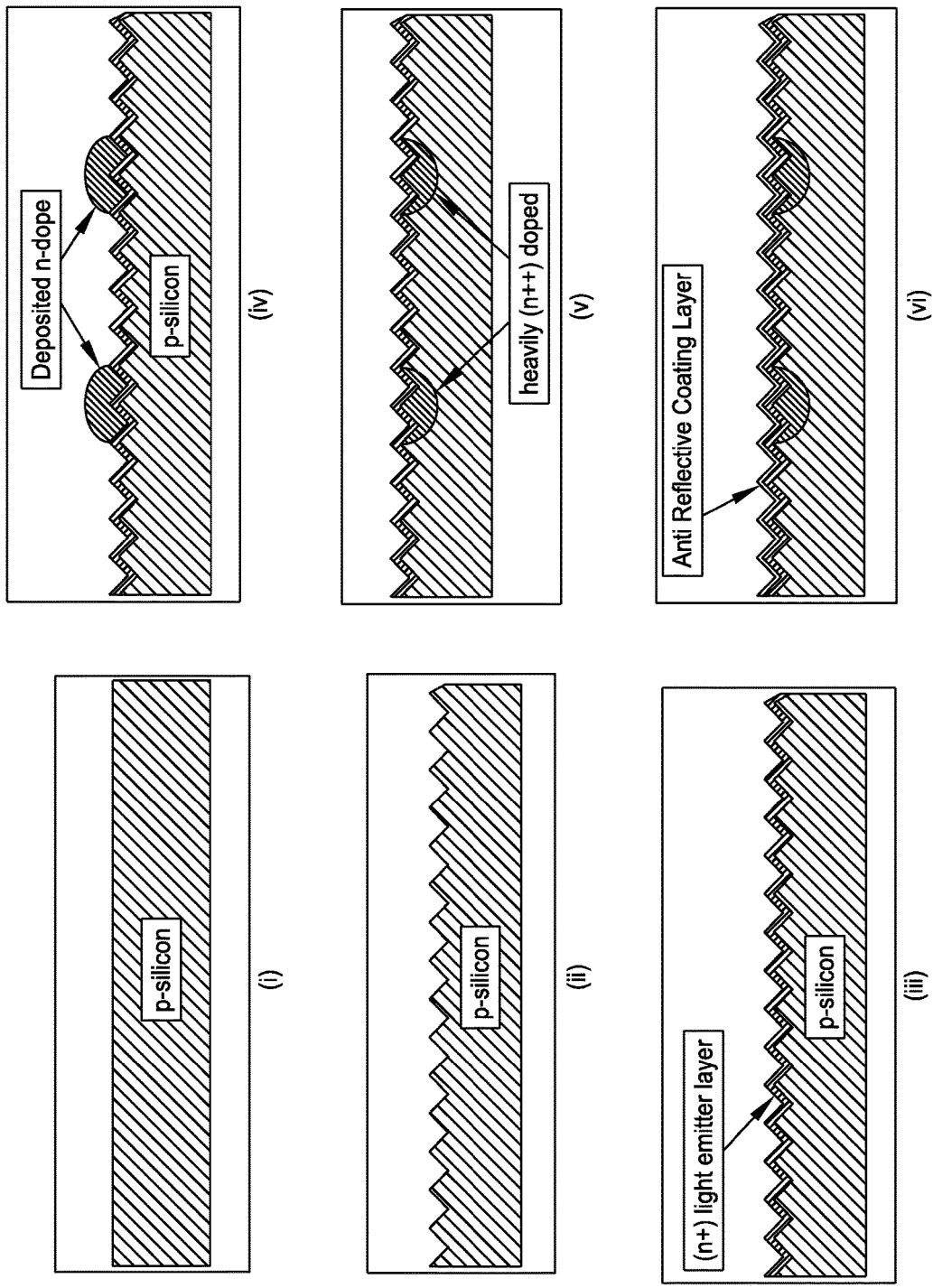
FIG. 4A is a schematic representation of a method for producing a selective emitter structure in c-Si with n-dope inkjet formulation in accordance with one embodiment of the present disclosure.
Figure 4A:
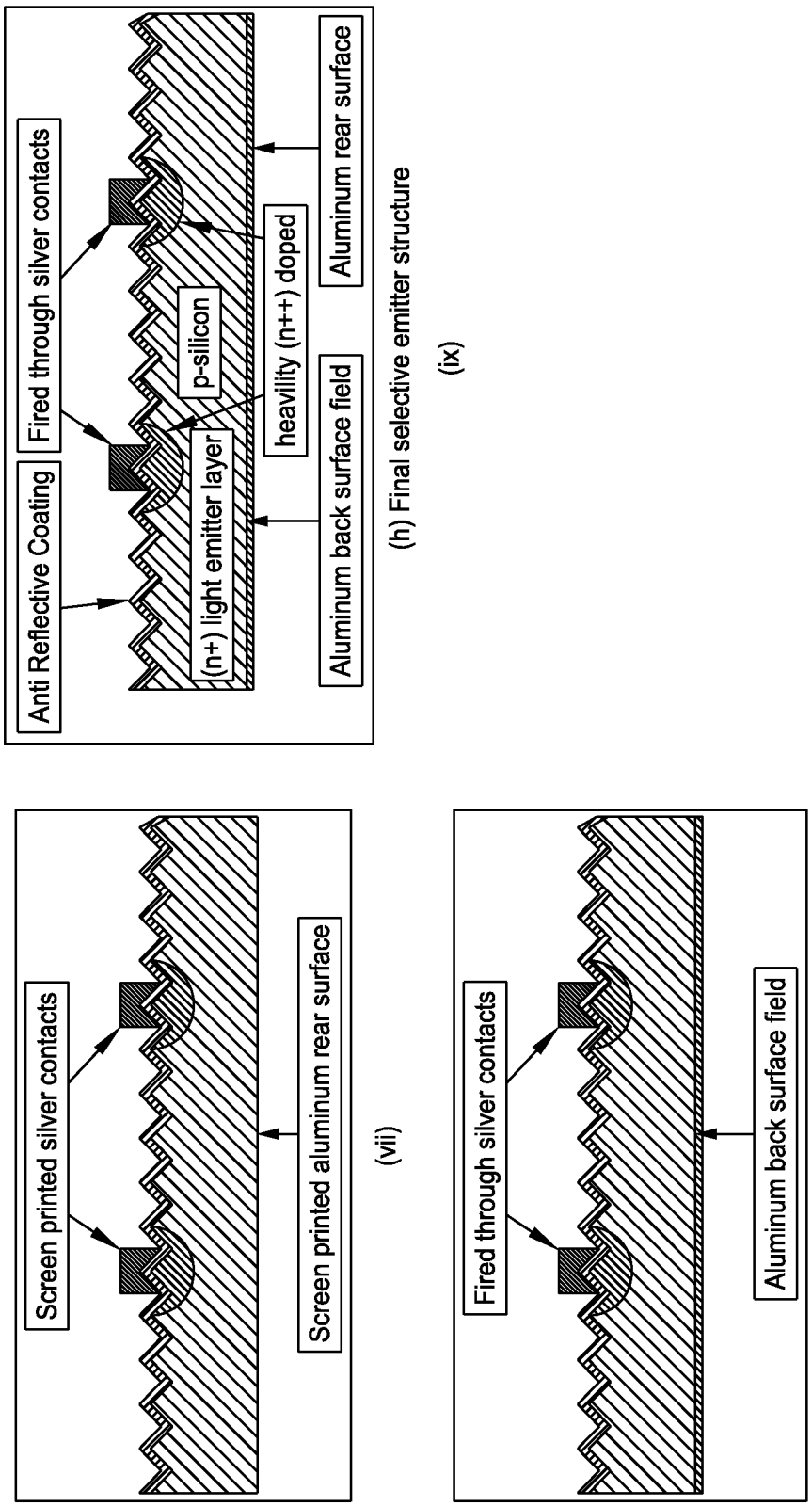

FIG. 4A presents a non-limiting processing schematic for producing a selective emitter structure in c-Si with n-dope inkjet formulation in accordance with one or more embodiments. The process starts with a p-type crystalline silicone substrate which is subsequently textured. An (n+) light emitter layer is then diffused followed by inkjetting of an n-dopant. The inkjetted n-dope is diffused to create heavily doped (n++) regions. An anti reflective coating layer is then deposited. Screen print metallization and fire metallization may be performed to produce a final selective emitter structure.

Non-limiting n-dope formulations may contain 1 to 90 wt % active ingredient(s) with the remainder containing any combination of the following, 10 to 90 wt % solvent(s), 0 to 5 wt % surfactant(s), 0 to 5 wt % antifoam agent(s). Active ingredient(s) are defined as any soluble compound containing a periodic table group VA element (typically phosphorus or arsenic). Examples source(s) include phosphorous pentoxide ($P_2O_5$), phosphoric acid ($H_3PO_4$), pyrophosphoric acid ($H_4P_2O_7$), polyphosphoric acid, phosphate salts, etc. A solvent is defined as any chemical or chemical mixtures, organic or inorganic, which readily dissolve and or create homogenous mixtures with the active ingredient(s). A surfactant is defined as any material added with the sole purpose of controlling surface tension properties of the formulation. Antifoam agents are defined as any material added to the formulation to reduce or eliminate foaming of the formulation. It has been found that formulations which contain acetates such as (methyl-, ethyl-, proply-, butyl-, pentyl-, hexyl-, heptyl-, octyl-acetate) within the "solvent mixture" minimize or eliminate unwanted residue(s).

In accordance with one or more embodiments, a printable ink may function as a p-dope. The p-dope is typically printed upon a "bare" (non-silicon nitride or oxynitride containing) mono or poly crystalline silicon substrate. After printing, the substrate can be first heated to temperatures of 175° C. to 250° C. to initiate a reaction which will create a p-dope containing film upon the substrate. This initial heat step is not mandatory but does minimize spread of the p dope material and maximizes the dopant concentration over printed area. The substrate then can be diffused at temperatures of about 800° C. to greater than about 1000° C. The diffusion time depends on the chosen diffusion temperature, initial dopant concentration (sheet resistance) of the p layer and final dopant concentration (sheet resistance) required in the p+ region.

Non-limiting p-dope formulations contain 1 to 90 wt % active ingredient(s) with the remainder containing any combination of the following, 10 to 90 wt % solvent(s), 0 to 5 wt % surfactant(s), 0 to 5 wt % antifoam agent(s). Active ingredient(s) are defined as any soluble compound containing a periodic table group IIIA element (typically boron or aluminum). Examples source(s) include boron trioxide ($B_2O_3$), boric acid ($H_3BO_3$), triethyl borate, etc.

In some embodiments, an ink may facilitate p-doping and provide catalyst for plating. Inks may therefore function as catalytic p-dopants in accordance with one or more embodiments.

In accordance with one or more embodiments, an ink may be a bifunctional ink. The term "bifunctional" generally refers to an inkjet fluid which can readily etch pre-deposited silicon nitride or oxynitride layers while also containing material to dope n+ layers in the underlying silicon. The bifunctional dopant is typically printed upon a silicon nitride or silicon oxynitride coated mono or poly crystalline silicon substrate. After printing, the silicon nitride or oxynitride can be first etched at temperatures of about 225° C. to about 350° C. for about 30 seconds or more. Following etching, a diffusion step is required at temperatures of about 800° C. to about 1000° C. The diffusion time depends on the chosen diffusion temperature, initial dopant concentration (sheet resistance) of the n layer and final dopant concentration (sheet resistance) required in the n+ region.

Figure 4B:
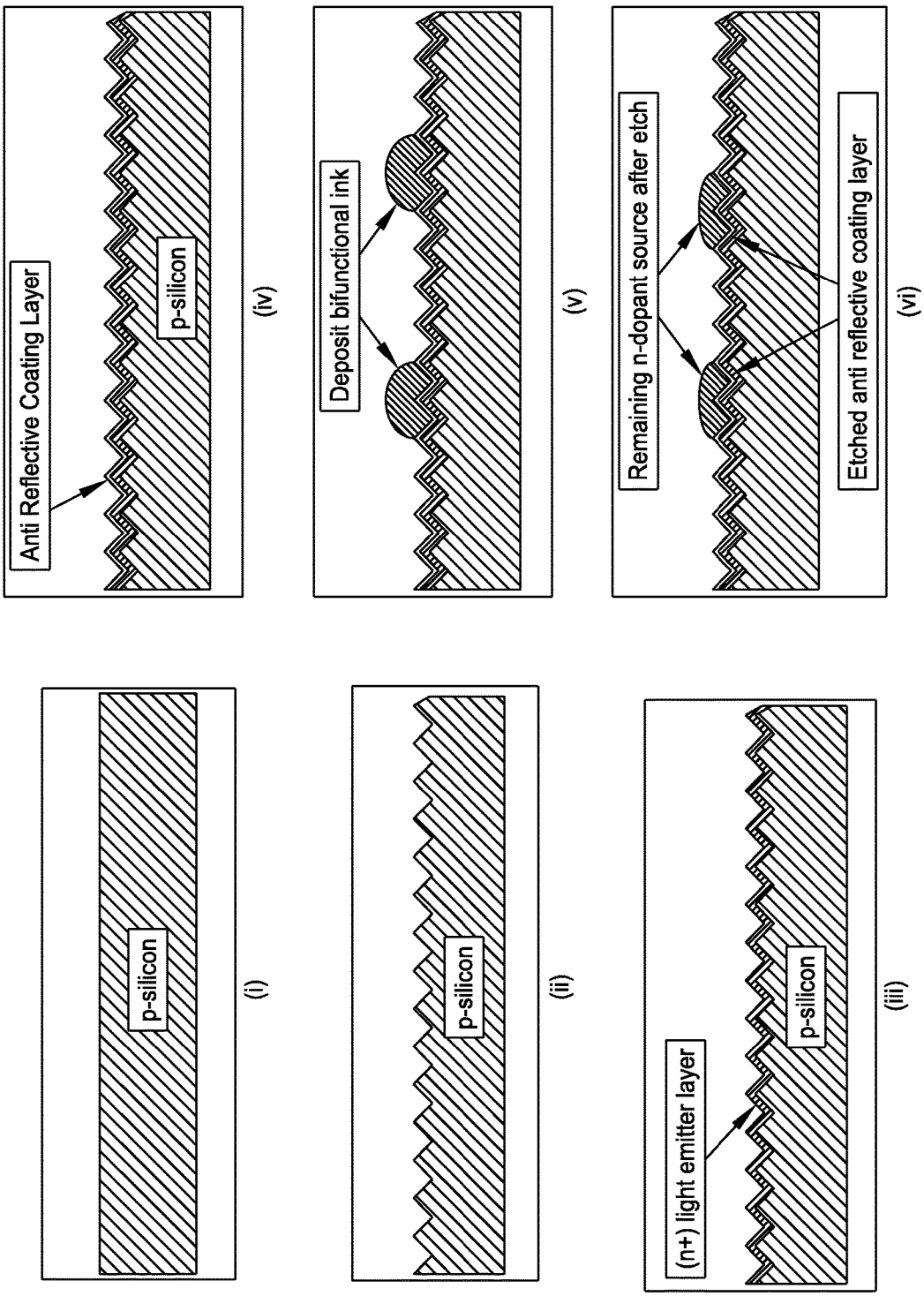
FIG. 4B is a schematic representation of a method for producing a selective emitter structure in c-Si with a bifunctional inkjet formulation in accordance with one embodiment of the present disclosure.
Figure 4B:
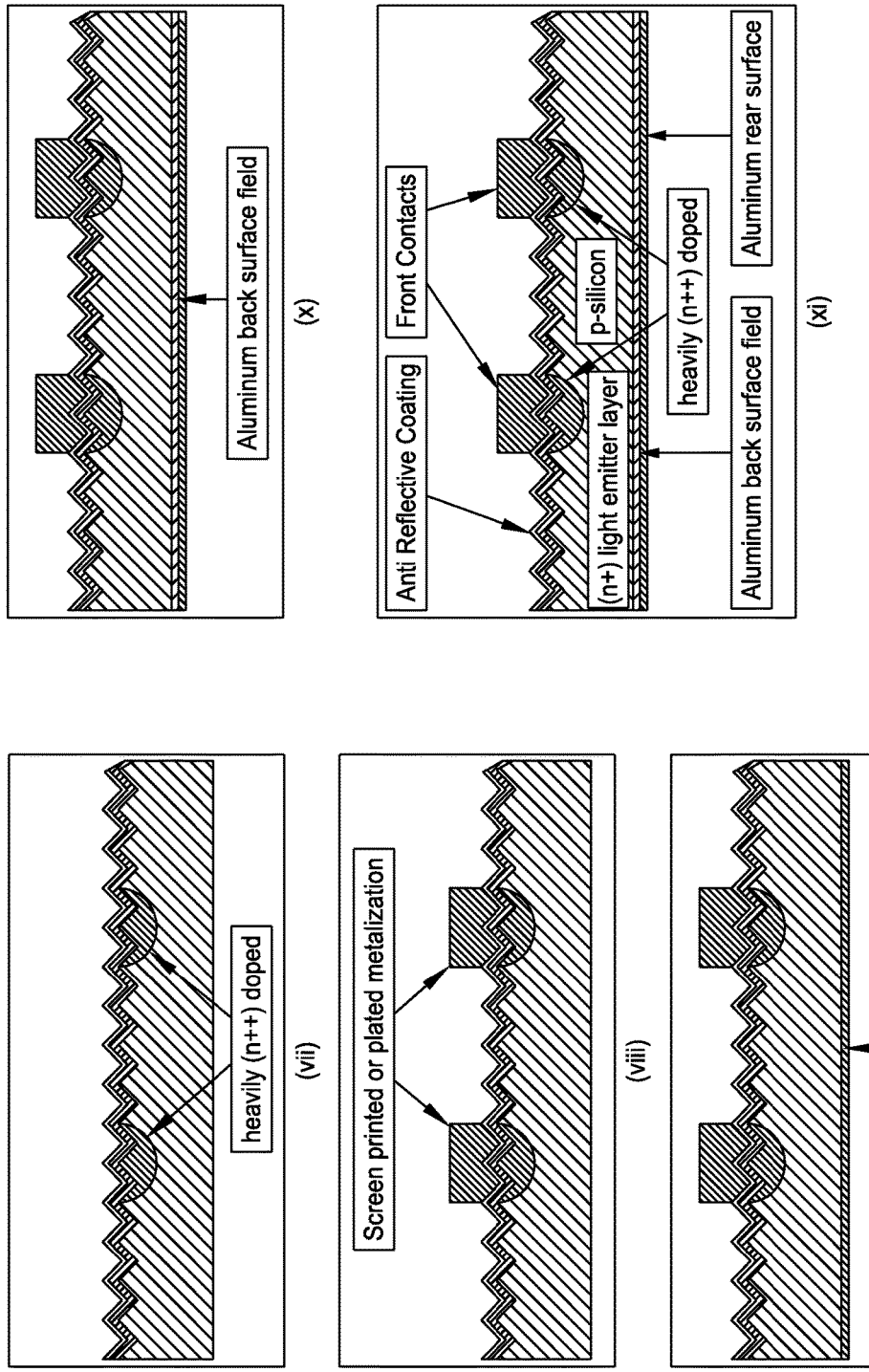

FIG. 4B presents a non-limiting processing schematic for producing a selective emitter structure in c-Si with a bifunctional inkjet formulation. A p-type crystalline silicone substrate may be texturized. An (n+) light emitter layer may be diffused prior to deposition of an anti reflective coating layer. A bifunctional ink may then be inkjetted. The anti reflective coating layer may be etched using the bifunctional ink. The remaining n-dope source may be diffused to create heavily doped (n++) regions. Screen print or plate contact metallization may be performed. Screen print backside metallization and/or fire metallization may also be performed to produce a final selective emitter structure.

Non-limiting bifunctional formulations may contain 1 to 90 wt % active ingredient(s) with the remainder containing any combination of the following, 10 to 90 wt % solvent(s), 0 to 5 wt % surfactant(s), and/or 0 to 5 wt % antifoam agent(s). Active ingredient(s) are defined as any soluble compound containing a periodic table group VA element (typically phosphorus or arsenic). Examples source(s) include phosphorous pentoxide ($P_2O_5$), phosphoric acid ($H_3PO_4$), pyrophosphoric acid ($H_4P_2O_7$), polyphosphoric acid, phosphate salts, etc. It has been found that formulations which contain Acetates such as (methyl-, ethyl-, proply-, butyl-, pentyl-, hexyl-, heptyl-, octyl-Acetate) within the "solvent mixture" minimize or eliminate unwanted residue(s).

In accordance with one or more embodiments, an ink may be a trifunctional. The term "trifunctional" refers to an inkjet fluid which can readily etch pre-deposited silicon nitride or oxynitride layers while containing materials which catalyze the surface to initiate electroless nickel plating and also dope n+ layers in the underlying silicon. The trifunctional dopant is typically printed upon one of the following: silicon, silicon nitride, or silicon oxynitride coated mono or poly crystalline silicon substrate. After printing on top of a silicon nitride or oxynitride coated substrate, the substrate can be first etched at temperatures of about 225° C. to greater than about 350° C. for about 30 seconds or greater. If printed upon silicon the substrate can be first dried at temperatures of about 175° C. or less or directly placed into a diffusion furnace. Following etching or drying, lower contact resistance is achieved by a diffusion step at temperatures of about 800° C. to about 1000° C. The diffusion time depends on the chosen diffusion temperature, initial dopant concentration (sheet resistance) of the n layer and final dopant concentration (sheet resistance) required in the n+ region. However, the 800° C. to 1000° C. diffusion step is not mandatory to initiate nickel plating on the printed areas. Therefore, if only nickel plating is required, the diffusion step can be skipped. However, after printing to promote good adhesion of the nickel, it is recommended that the substrate experience a temperature of about 300° C. or more before plating. Following the heat treatment, in order to initiate nickel plating on the printed areas the wafer must be dipped into an acidic or basic electroless nickel bath at a characteristic bath temperature. The substrate should be kept in the nickel bath for as long as is required to deposit a continuous nickel layer. The nickel layer must then be brought to a temperature of about 250° C. to about 300° C. to form low resistivity nickel silicide ($Ni_2Si$) or greater than about 300° C. to form a higher resistivity nickel silicide ($NiSi_2$). The nickel containing areas can then be further plated up with a chosen metal such as copper, silver and/or tin.

Figure 4C:
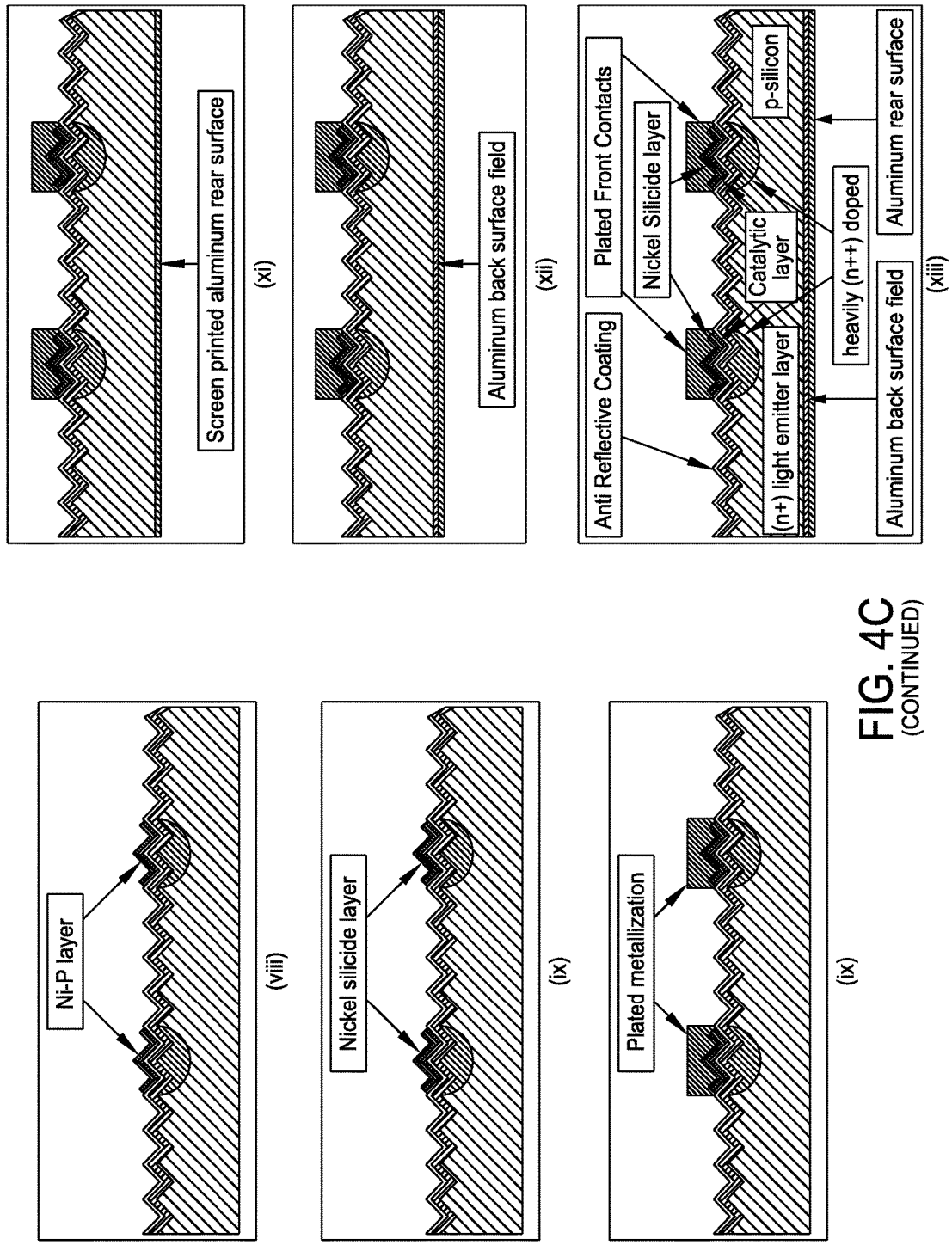
FIG. 4C is a schematic representation of a method for producing a selective emitter structure in c-Si and plated contacts with a trifunctional inkjet formulation in accordance with one embodiment of the present disclosure.

FIG. 4C presents a non-limiting processing schematic for producing a selective emitter structure in c-Si and plated contacts with a trifunctional inkjet formulation. A p-type crystalline silicone substrate may be texturized. An (n+) light emitter layer may be diffused prior to deposition of an anti reflective coating layer. A trifunctional ink may then be inkjetted. The anti reflective coating layer may be etched while simultaneously depositing catalyst. The remaining n-dope source may be diffused to create heavily doped (n++) regions. The Ni—P layer may then be electroless plated. The Ni—P layer may be heated to form nickel silicide. The desired contact metallization layer may be plated, such as with copper, tin, silver or any desired combination. Screen print backside metallization and/or fire metallization may be performed to produce a final selective emitter plated contact structure.

Non-limiting trifunctional formulations may contain 1 to 90 wt % active ingredients with the remainder containing any combination of the following, 10 to 90 wt % solvent(s), 0 to 10 wt % reducing agents(s), 0 to 5 wt % surfactant(s), and/or 0 to 5 wt % antifoam agent(s). The trifunctional ink contains a minimum of one compound from each of two classes of active ingredients. Class I is defined as any soluble compound containing periodic table group VA element(s) (typically phosphorus or arsenic). Class II is defined as any compound that, when solubilized, contains components which after being reduced form atoms that will catalyze electroless nickel deposition. Examples source(s) of Class I active ingredient(s) include: phosphorous pentoxide ($P_2O_5$), phosphoric acid ($H_3PO_4$), pyrophosphoric acid ($H_4P_2O_7$), polyphosphoric acid, phosphate salts etc. Examples source(s) of Class II active ingredient(s) include palladium (II) chloride, palladium (IV) chloride, palladium (II) acetate, trans-diamminedichloro-palladium(II), cis-diamminedichloro-palladium(II), tetraammine palladium hydrogen carbonate, tetraammine-palladium(II) chloride, Sodium tetrachloropalladate(II), potassium tetrachloropalladate(II), palladium(II) nitrate, palladium(II) oxide, palladium(II) iodide, diamminedinitropalladium(II). Reducing agent(s) are defined as any chemical or a chemical compound which will readily dissolve in the solvent(s) and contains elements which when dissolved have a more negative standard electrode potential than the dissolved catalytic component or components. It has been found that formulations which contain Acetates such as (methyl-, ethyl-, proply-, butyl-, pentyl-, hexyl-, heptyl-, octyl-Acetate) within the "solvent mixture" minimize or eliminate unwanted residue(s).

In accordance with one or more embodiments, an ink may function as an etch for any metal. Such metals include, but are not limited to, aluminum, nickel vanadium, gold, silver, copper, palladium and platinum.

For example, an ink may be an aluminum etch or an aluminum etch-nickel catalyst in accordance with one or more non-limiting embodiments. The aluminum etch refers to an inkjet fluid which can readily etch pre-deposited aluminum and passivation layers. The aluminum etch nickel catalyst version contains materials to also initiate electroless nickel plating on the printed areas after etching. The aluminum etch and nickel catalyst versions are typically printed upon a sputtered or screen printed aluminum coated mono or poly crystalline silicon substrate. After printing, depending on the aluminum and passivation layer thickness and the active ingredient(s), a coated wafer can be etched at a temperature of about 25° C. to about 60° C. or greater. The etch time depends on aluminum and passivation layer thickness and active ingredient(s). After etching, if nickel plating is not required, a distilled water rinse is recommended. However, after printing with the nickel catalyst version, for enhanced adhesion the wafer must be exposed to temperatures of about 350° C. or greater. Following the heat treatment, in order to initiate nickel plating on the printed areas the wafer must be dipped into an acidic or basic electroless nickel bath at a characteristic bath temperature. The substrate should be kept in the nickel bath for as long as is required to deposit a continuous nickel layer. The nickel layer must then be brought to a temperature of about 250° C. to about 300° C. to form low resistivity nickel silicide ($Ni_2Si$) or greater than about 300° C. to form a higher resistivity nickel silicide ($NiSi_2$). The nickel containing areas can then be further electroplated with a chosen metal such as copper and/or tin.

Figure 4D:
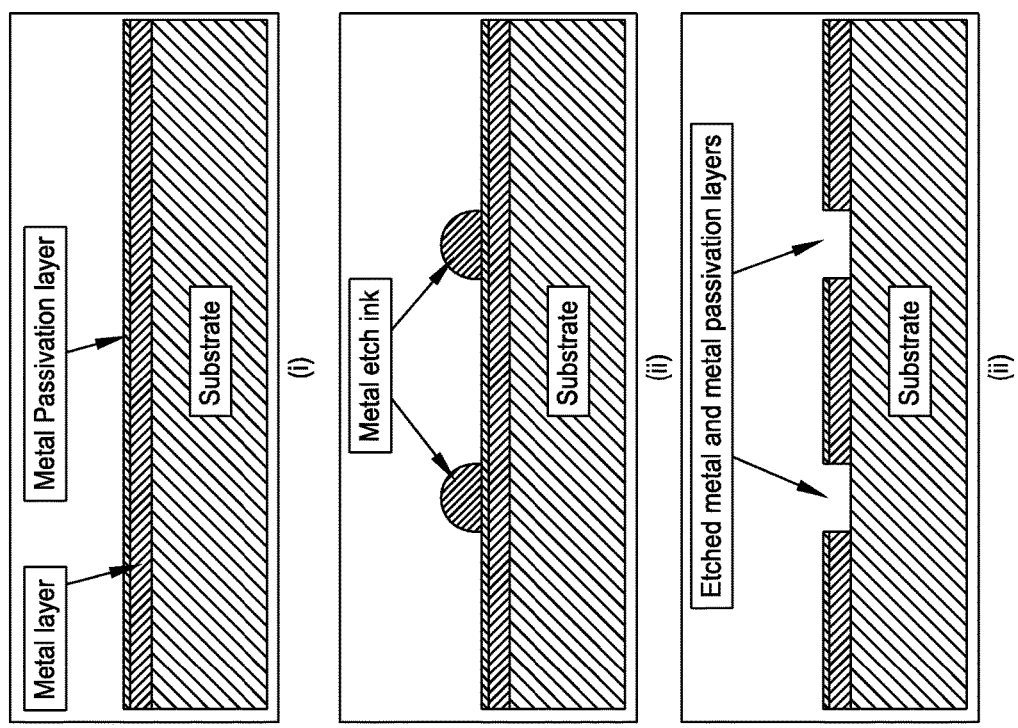
FIG. 4D is a schematic representation of a method utilizing metal etch inkjet formulations to etch structures in metal and metal passivation layers in accordance with one embodiment of the present disclosure.

FIG. 4D presents a non-limiting processing schematic for utilizing metal etch inkjet formulations to etch structures in metal and metal passivation layers. A substrate is coated with a metal and a passivation layer. A metal etch ink is then inkjetted. The substrate is set to the etch temperature. Metal and passivation layers are then simultaneously etched.

Non-limiting aluminum etch formulations may contain 1 to 90 wt % active ingredients with the remainder containing any combination of the following, 10 to 90 wt % solvent(s), 0 to 10 wt % reducing agents(s), <1 to 20 wt % pickling agent(s), 0 to 5 wt % surfactant(s), and 0 to 5 wt % antifoam agent(s). The aluminum and passivation layer etch nickel catalyst ink contains a minimum of one compound from each of two classes of active ingredients. Class I is defined as any soluble compound which will readily dissolve in the solvent(s) and contains elements which when dissolved have a higher standard electrode potential than the metal it was deposited onto and/or soluble compound containing a periodic table group IA element. Class II is defined as any soluble palladium containing compound. Examples source(s) of Class I active ingredient(s) include copper (II) sulfate, gold (I) chloride, gold (III) chloride, ammonium fluoride, nitric acid, sulfuric acid, nickel (II) chloride, iron (II) chloride, iron (III) chloride, zinc (II) chloride, potassium hydroxide, sodium hydroxide, lithium hydroxide. Examples source(s) of Class II active ingredient(s) include palladium (II) chloride, palladium (IV) chloride, palladium (II) acetate, trans-diamminedichloro-palladium(II), cis-diamminedichloro-palladium(II), tetraammine palladium hydrogen carbonate, tetraammine-palladium(II) chloride, sodium tetrachloropalladate(II), potassium tetrachloropalladate(II), palladium(II) nitrate, palladium(II) oxide, palladium(II) iodide, diamminedinitropalladium(II). A pickling agent is defined as any chemical or chemical mixtures which readily remove the metal passivation layer. Example sources of pickling agents are: hydrochloric, sulfuric, nitric, and phosphoric acids. It has been found that formulations which contain acetates such as (methyl-, ethyl-, proply-, butyl-, pentyl-, hexyl-, heptyl-, octyl-acetate) within the "solvent mixture" minimize or eliminate unwanted residue(s).

In another example, an ink may be a nickel vanadium etch or a nickel vanadium etch-nickel catalyst in accordance with one or more embodiments. The nickel vanadium etch refers to an inkjet fluid which can readily etch pre-deposited nickel vanadium and passivation layer. The nickel vanadium etch nickel catalyst version contains materials to initiate electroless nickel plating on printed areas after etching. The nickel vanadium etch and nickel catalyst version are typically printed upon a sputtered nickel vanadium coated mono or poly crystalline silicon substrate. After printing, depending on the nickel vanadium thickness and the active ingredient(s), a coated wafer can be etched at a temperature of about 25° C. to about 60° C. or greater. After etching, if nickel plating is not required, a distilled water rinse is recommended. However, after printing with the nickel catalyst version for enhanced nickel adhesion the wafer must be exposed to temperatures of about 350° C. or more. Following the heat treatment, in order to initiate nickel plating on the printed areas the wafer must be dipped into an acidic or basic electroless nickel bath at a characteristic bath temperature. The substrate should be kept in the nickel bath for as long as is required to deposit a continuous nickel layer. The nickel layer must then be brought to a temperature of about 250° C. to about 300° C. to form low resistivity nickel silicide ($Ni_2Si$) or greater than about 300° C. to form a higher resistivity nickel silicide ($NiSi_2$). The nickel containing areas can then be further plated up with a chosen metal such as copper and/or tin.

Table 2 presents some preferred inkjet fluid formulations in accordance with one or more non-limiting embodiments.

TABLE 2

| | n-dope | Bifunctional | Trifunctional | p-dope | p-dope/ Catalyst | Metal Etch | Metal Etch! Catalyst |
|---|---|---|---|---|---|---|---|
| Solvent/Solvent Mixture 1 (wt %) | 85-94 | 55-65 | 20-30 | 85-94 | 50-70 | 10-30 | 10-30 |
| Solvent/Solvent Mixture 2 [N* Acetate] (wt %) | | 30-40 | 30-40 | | | | |
| Active Ingredient Group VA (Class 1) [mol/liter] | 0.8-2.1 | 3.2-5.00 | 3.2-5.00 | | | 8.3-11.40 | 8.3-11.40 |
| Active Ingredient Group IIIA (Class 1) [mol/liter] | | | | 1.8-5.00 | 1.8-5.00 | | |
| Active Ingredient [Gold (II, III) Chloride](wt %) | | | | | | <1 | <1 |
| Active Ingredient [Nitric Acid] (wt %) | | <1 | <1 | | | 0-15 | 0-15 |
| Active Ingredient (Class 2) (wt %) | | | <1 | | <1 | | <1 |
| Reducing Agent (wt %) | | | <1 | | <1 | | <1 |
| Pickling Agent (wt %) | | | | | <1 | 0-5 | <1-5 |
| Surfactant (wt %) | <1 | <1 | <1 | <1 | <1 | <1 | <1 |
| Anti Foam Agent (wt %) | <1 | <1 | <1 | <1 | <1 | <1 | <1 |

N* in connection with Solvent 2 above represents a weight percent range of any single or mixture of acetates with a molecular formula of $C_xH_yO_2$ where the most preferred values of $x$ is 3 to 10 and $y$ is 6 to 20.

In accordance with one or more embodiments, inks may be fabricated by mixing the components together at room temperature and then filtering the ink through a filter, for example a 0.2 micron filter. Generally, the non-acid ink components (alcohols, diols, acetates, and other solvents) may be premixed and then the acid(s) may be added to the solvent mixture.

In some embodiments, the inks may be used in a non-contact inkjet selective emitter solution for solar front contacts (c-Si). Such an approach may generally be single-step, high-purity, non-contact and cost-effective. High-purity components may minimize high mobility cationic (metallic) contamination diffusion into silicon. In some embodiments, enhanced cell efficiency of about 0.5% to about 0.6% or greater may be achieved. More efficient front contacts may be enabled by etching through a SiNx ARC layer followed by diffusion doping of a silicon emitter with a disclosed ink formulation. A selective emitter approach may decouple the metallization process from the etching/doping process to maximize the results of both. Precise deposition performance may also be achieved, with 50 micron print demonstrated. The capability of etching precise 50 micron features has been demonstrated. In some embodiments, etching features of below 50 microns may be achieved. In at least one embodiment, etching features of 35 microns or less may be achieved.

In accordance with one or more embodiments, an inkjet material may be jetted from a printhead. In at least some embodiments, printheads for the inkjet deposition may be designed to be substantially inert and perform reliably with the disclosed ink formulations, such as for use in solar technologies. The printhead may generally be able accommodate the deposition of solar process fluids including acidic dopants and alkaline etchants. In accordance with one or more embodiments, inks may be jettable using such equipment as the Dimatix DMP 2800 (10 pl or 1 pl) and Trident Pixel Jet or 256Jet-S ink jet heads (both 7 and 30 pl) at head temperatures of about 25° C. to about 70° C. and platen temperatures of about room temperature to more than about 100° C. Other inkjet print equipment may be used.

Table 3 presents some additional preferred inkjet fluid formulations in accordance with one or more non-limiting embodiments.

TABLE 3

55.0 wt % (85 wt % H3PO4 in H2O)/10.0 wt % Glacial Acetic acid/10.0 wt % Nitric Acid (70 wt % in H2O)/5.0 wt % (30% Au (III) Chloride in HCL)/10.0 wt % (37 wt. % HCL in H2O)/10.0 wt % DI H2O
68.46 wt % (85 wt % H3PO4 in H2O)/10.0 wt % Glacial Acetic acid/8.0 wt % Nitric Acid (70 wt % in H2O)/2.4 wt % (30% Au (III) Chloride in HCL)/10.0 wt % (37 wt. % HCL in H2O)/10.0 wt % DI H2O/1 wt % (48 wt % HF in H2O)
58.48 wt % (85 wt % H3PO4 in H2O)/10.0 wt % Glacial Acetic acid/10.0 wt % Nitric Acid (70 wt % in H2O)/1.52 wt % Pd (II) Chloride/10.0 wt % (37 wt. % HCL in H2O)/10.0 wt % DI H2O
50.00 wt % (85 wt % H3PO4 in H2O)/10.0 wt % Nickel (II) Nitrate hexahydrate/10.0 wt % Nitric Acid (70 wt % in H2O)/25.0 wt % (37 wt. % HCL in H2O)/5.0 wt % DI H2O
42.5 wt % (85 wt % H3PO4 in H2O)/8.5 wt % Nickel (II) Nitrate hexahydrate/8.5 wt % Nitric Acid (70 wt % in H2O)/21.7 wt % (37 wt. % HCL in H2O)/18.8 wt % DI H2O
55.0 wt % (85 wt % H3PO4 in H2O)/5.0 wt % Nickel (II) Nitrate hexahydrate/10.0 wt % Nitric Acid (70 wt % in H2O)/15.0 wt % (37 wt. % HCL in H2O)/15.0 wt % DI H2O
60.0 wt % (85 wt % H3PO4 in H2O)/10.0 wt % Nickel (II) Nitrate hexahydrate/15.0 wt % (37 wt. % HCL in H2O)/15.0 wt % DI H2O
70.0 wt % (85 wt % H3PO4 in H2O)/10.0 wt % Nickel (II) Nitrate hexahydrate/9.9 wt % (37 wt. % HCL in H2O)/10.0 wt % DI H2O/0.1 wt % TEOS
45.0 wt % (85 wt % H3PO4 in H2O)/5.0 wt % Nickel (II) Nitrate hexahydrate/21.8 wt % Hexyl Acetate/10.0 wt % DI H2O/0.5 wt % FC4430/12.7 wt % 1-Butanol/5.0 wt % (37 wt. % HCL in H2O)
50.0 wt % (85 wt % H3PO4 in H2O)/10.0 wt % Nickel (II) Nitrate hexahydrate/15.0 wt % Ethylene Glycol/10.0 wt % DI H2O/10.0 wt % 1-Butanol/5 wt % (37 wt % HCL in H2O)
54.5 wt % (85 wt % H3PO4 in H2O)/15.1 wt % Nickel (II) Nitrate hexahydrate/20.3 wt % Ethylene Glycol/10.1 wt % DI H2O
46.0 wt % (85 wt % H3PO4 in H2O)/15.0 wt % Nickel (II) Nitrate hexahydrate/8.0 wt % Ethylene Glycol/5.0 wt % Glacial Acetic Acid/10.0 wt % DI H2O/8.0 wt % Ethylene Glycol Butyl Ether
46.0 wt % (85 wt % H3PO4 in H2O)/15.0 wt % Nickel (II) Nitrate hexahydrate/13.0 wt % Ethylene Glycol/16.0 wt % npa/10.0 wt % DI H2O
46.0 wt % (85 wt % H3PO4 in H2O)/15.0 wt % Nickel (II) Nitrate hexahydrate/13.0 wt % Ethylene Glycol/16.0 wt % EtOH/15.0 wt % DI H2O
46.0 wt % (85 wt % H3PO4 in H2O)/14.0 wt % Nickel (II) Nitrate hexahydrate/14.0 wt % Ethylene Glycol/15.6 wt % Glacial Acetic Acid/10.0 wt % DI H2O/0.4 wt % FS-35
45.0 wt % (85 wt % H3PO4 in H2O)/5.0 wt % Nickel (II) Nitrate hexahydrate/20.0 wt % H2SO4/5.0 wt % (37 wt. % HCL in H2O)/5 wt % Glacial Acetic Acid/20.0 wt % DI H2O Many of the inkjet formulations are inherently corrosive and/or act as pickling agents to various metals. Therefore, in order to ensure the expected jettability of the fluid, the printhead and any other materials such as tubing, reservoirs, and internal parts in contact with the specific formulation must be "inert" to that formulation. Inert may be generally defined by materials when in contact with the formulation at elevated temperatures common to printing (about 20° C. to about 90° C. or greater), do not readily dissolve, react or decompose. Furthermore, printheads constructed from materials which readily passivate such as austenitic, ferritic, martensitic, and/or duplex ("stainless" or "corrosion resistant") steel(s) should be deposited with an outer layer of a noble metal(s) such as gold, rhodium, platinum, palladium, silver, iridium, ruthenium, and/or osmium in areas that are in contact with the formulation. The inert layer can be deposited via art commonly known as electroplating.

In accordance with some non-limiting embodiments, etching may be achieved by heat treating inkjet printed parts to a temperature of about 250° C. to about 400° C. for about 0 to about 120 seconds on a hot plate or in an oven. These phosphoric acid based etchants will both etch and dope the Silicon (with Phosphorus) when printed samples are heated to a temperature of about 800° C. to about 1000° C. for about 0 to about 60 minutes in air in a box oven. Samples may be washed, such as in a 2 wt % HF solution for about 1 minute and then rinsed in DI water and dried before and after etching and/or doping. EDS analysis of etched and doped samples may show Phosphorus, but no residual Carbon or Nitrogen in the etched/doped surface regions.

The ink may etch through the SiNx ARC layer when heated to about 350° C. When heated to about 800° C., the n-dopant may diffuse into the silicon active emitter. A post-water rinse may complete the process. In some embodiments, silicon PV cell efficiency may be increased by removing the $SiN_x$ anti-reflective coating layer from the silicon for the purposes of selective doping and electroplating conductors.

In accordance with one or more embodiments, process steps may include ink deposition, etching and substrate cleaning. Methods may generally include providing a substrate having a surface layer, jetting droplets of an ink onto the surface layer, allowing the ink to react with the surface layer thus forming products of the etching reaction and thereby removing or otherwise modifying the physical properties of the surface layer in a desired pattern. It may be desirable to wash the substrate after etching to remove residue. In some embodiments, the ink may also facilitate deposition and/or doping.

The function and advantages of these and other embodiments will be more fully understood from the following examples. The examples are intended to be illustrative in nature and are not to be considered as limiting the scope of the embodiments discussed herein.

Example 1

An n-dope print fluid formulation was printed with a 10 pl drop volume and 40 um drop spacing upon a mono silicon substrate (which had an initial sheet resistance of about 75Ω/□) and diffused at about 950° C. for 10 minutes in air. After processing, final sheet resistances of less than about 20Ω/□ were achieved.

Example 2

A p-dope print fluid formulation was printed with a 10 pl drop volume and 40 um drop spacing upon a mono silicon substrate (which had an initial sheet resistance of about 75Ω/□) and heated to 175° C. for about 25 seconds, then diffused at 1000° C. for 15 min in air. After processing, final sheet resistances of less than about 40Ω/□ were achieved.

Example 3

A bifunctional print fluid formulation was printed with a 10 pl drop volume and 40 um drop spacing upon a mono silicon substrate (which had an initial sheet resistance of about 75Ω/□) etched at 350° C. for 5 minutes followed by 20 minute diffusion step in air at 950° C. After processing, final sheet resistances of less than about 15Ω/□ were achieved.

Example 4

Figure 5:
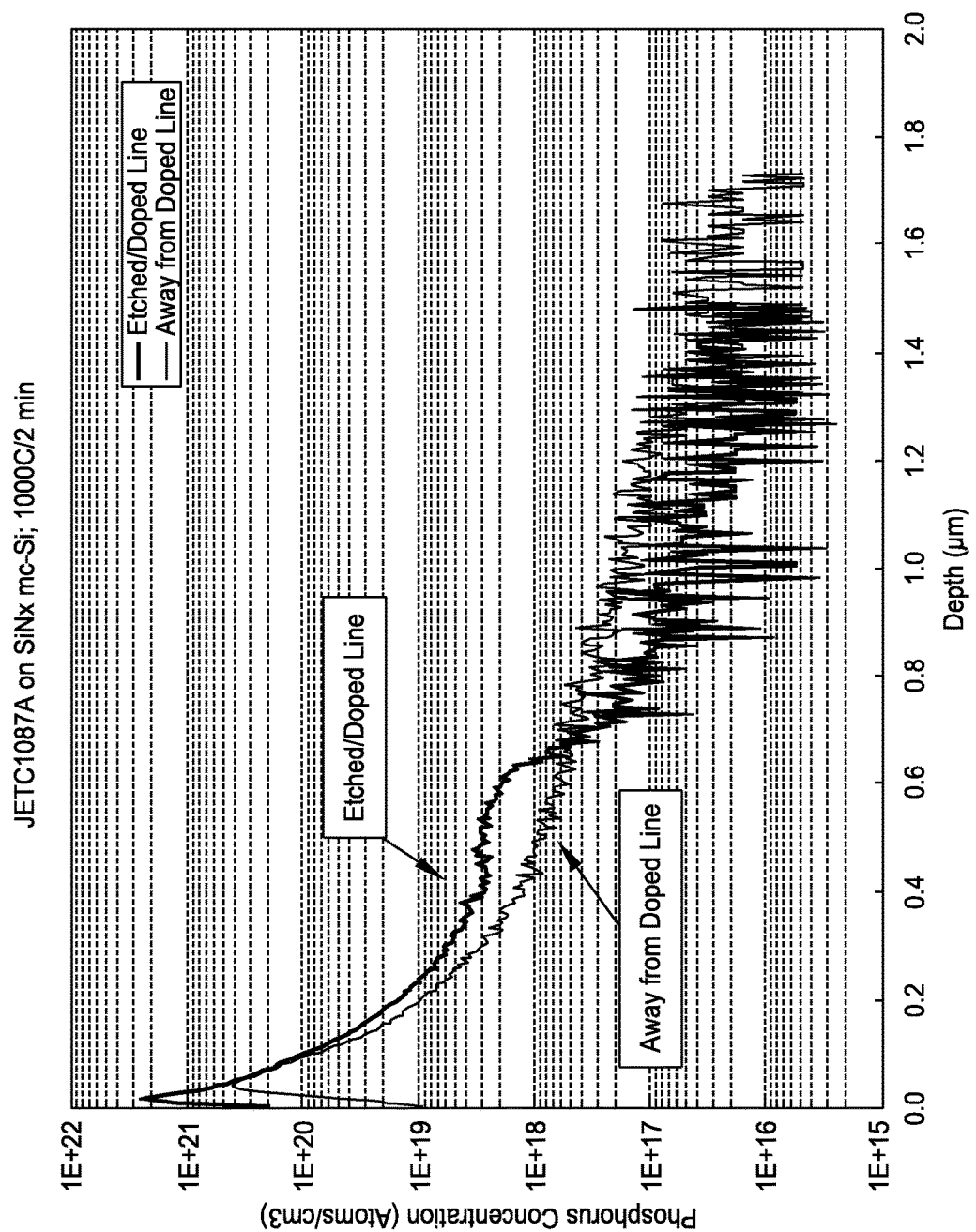
FIG. 5 is a graph showing phosphorous concentration versus depth.

Ink jetted etched lines of less than about 50 microns wide on SiNx coated mc-Si have been demonstrated. SIMS analysis on samples etched with a binfunctional ink and then heat treated at 1000° C. show the diffusion of phosphorus into the silicon, thereby creating n++ heavily doped silicon, and a corresponding reduction in the silicon surface resistance from about 100 ohms/sq to below about 40 ohms/sq. The SIMS diffusion profiles for both the heavily n-doped etched region (along etched line) and away from the etched line is shown in FIG. 5. Auger analysis of an etched sample (using a bifunctional ink) shows nitrogen in the non-etched region of the wafer (FIG. 6A) but no nitrogen along the etched line (FIG. 6B), indicating that the SiNx coating has been removed with etching.

Example 5

Figure 7B:
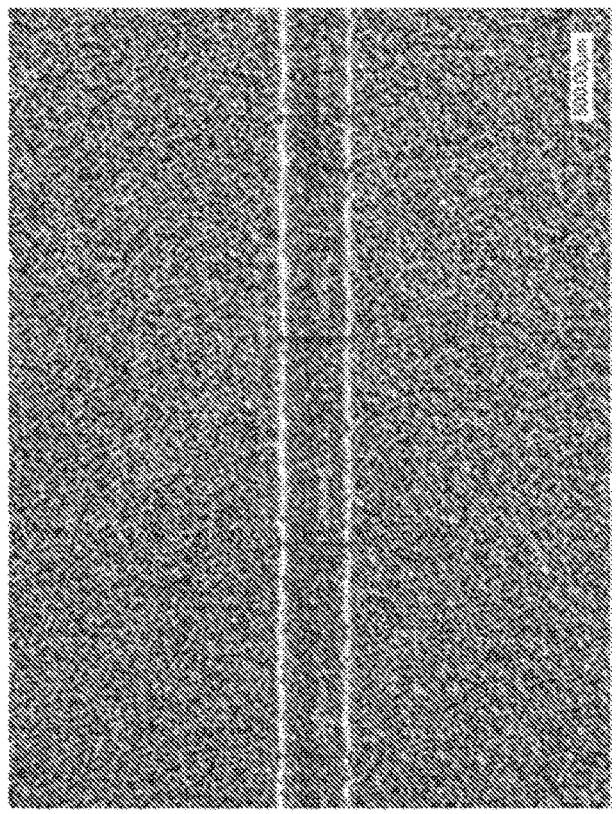
FIG. 7B is an enlarged view of the results shown in FIG. 7A.
Figure 7A:
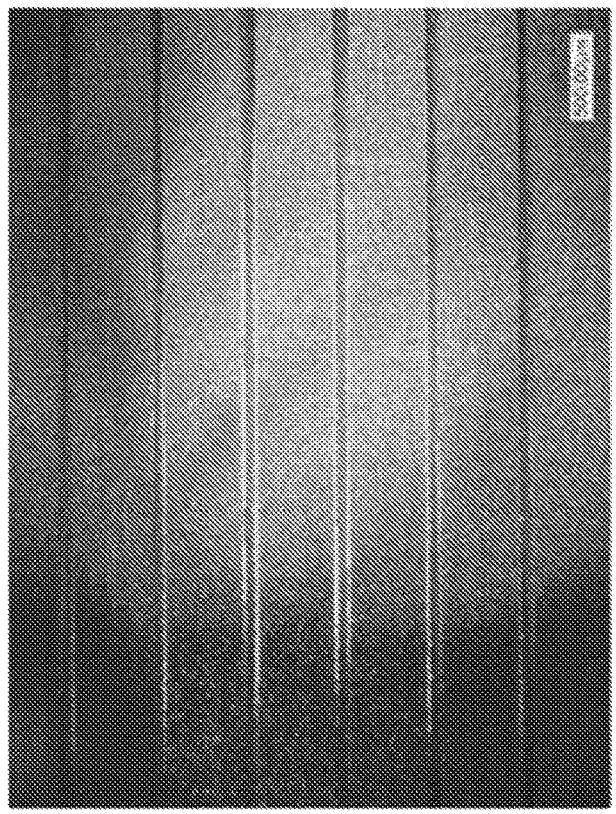
FIG. 7A shows the results of n-dope ink printed lines on mono-silicon.

Ink jetted lines with excellent edge definition (less than 20 microns) have been demonstrated with n-dope ink printed on mono- and mc-Silicon. FIG. 7A illustrates the results of n-dope ink printed lines on mono-silicon. The ink was jetted in one pass with a Dimatix DMP 2800 10 pl head at 1016 DPI, 25 Volts and 40° C. FIG. 7B presents a higher magnification image showing line width of 308-313 microns.

Example 6

Figure 8B:
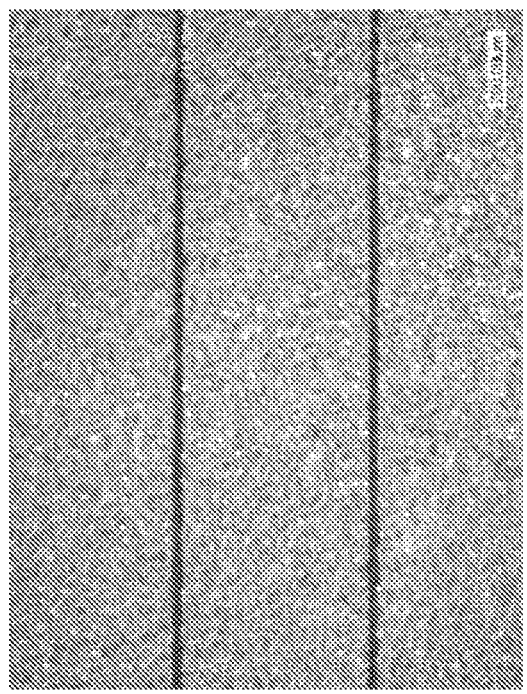
FIG. 8B is an enlarged view of the results shown in FIG. 8A.
Figure 8A:
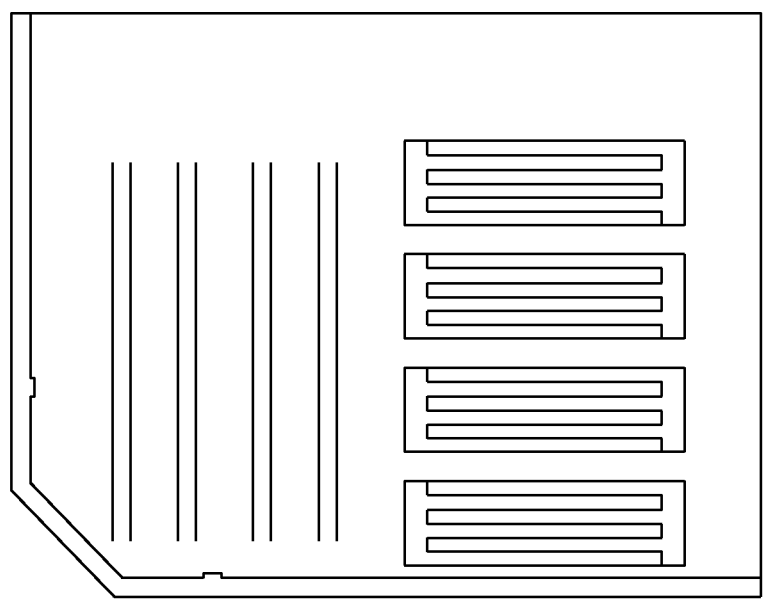
FIG. 8A shows metal etch ink pattern results after processing on mono-silicon wafer with silicon nitride and sputtered aluminum layers.

FIG. 8A presents metal etch ink pattern results after processing on mono-silicon wafer with silicon nitride and sputtered aluminum layers. FIG. 8B illustrates a higher magnification image showing the aluminum layer with etched line widths of about 87 microns.

Example 7

Figure 9B:
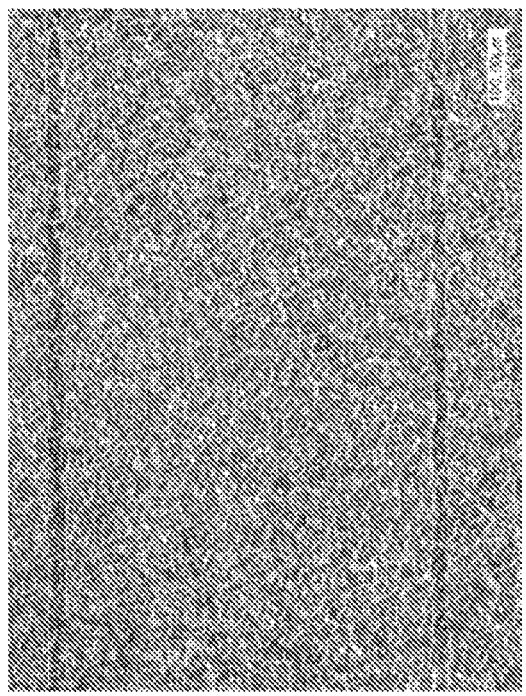
FIG. 9B is an enlarged view of the results shown in FIG. 9A.
Figure 9A:
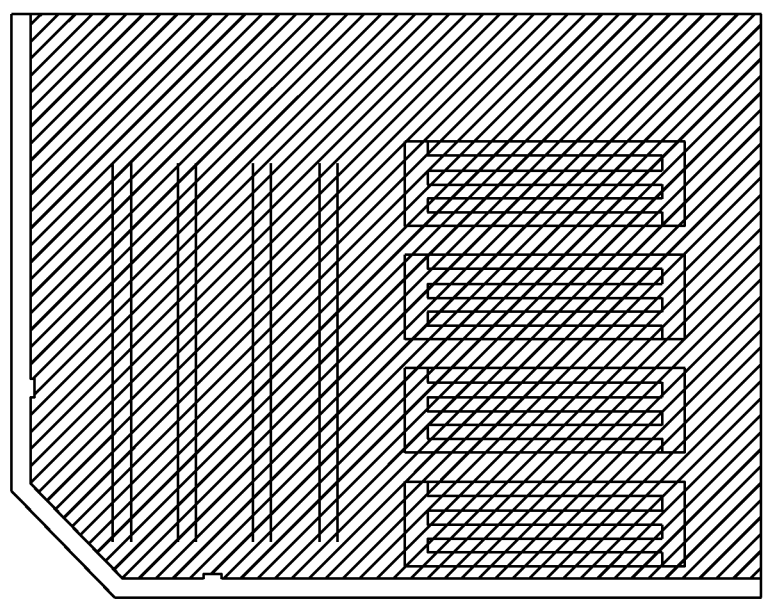
FIG. 9A shows metal etch ink pattern results after processing on mono-silicon wafer with silicon nitride and sputtered nickel vanadium layers.

FIG. 9A presents metal etch ink pattern results after processing on mono-silicon wafer with silicon nitride and sputtered nickel vanadium layers. FIG. 9B illustrates a higher magnification image showing the nickel vanadium layer with etched line widths of about 70 microns.

Example 8

Figure 10:
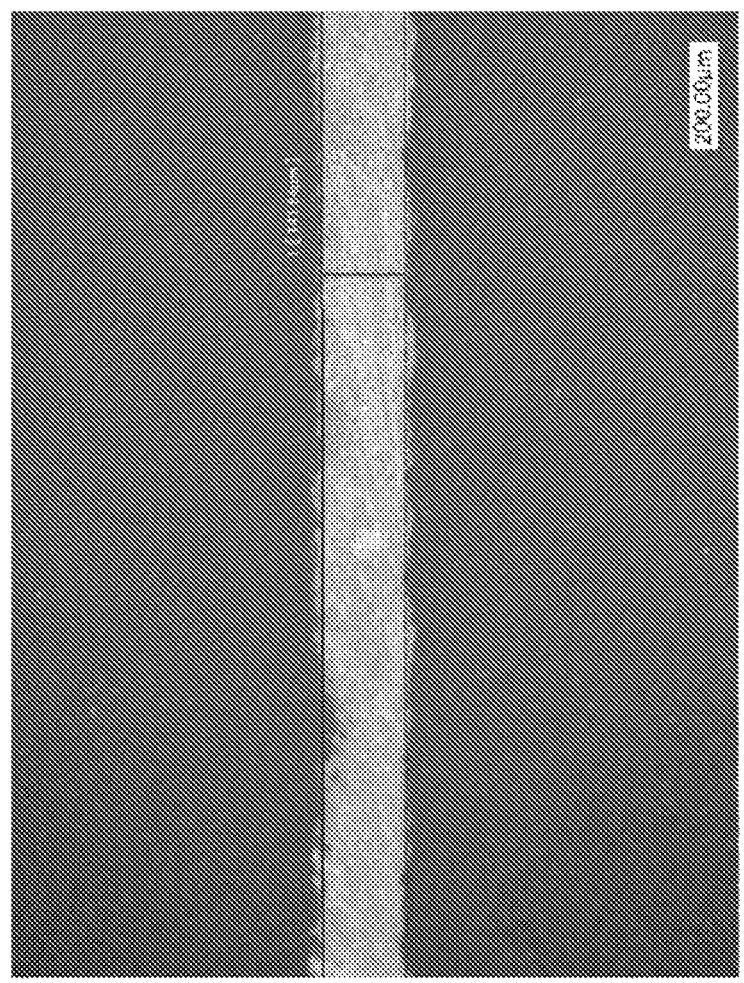
FIG. 10 shows the catalyzing of a nickel layer with a trifunctional ink upon printed areas after processing and a dip in an electroless nickel bath.

FIG. 10 demonstrates a trifunctional ink's ability to catalyze a nickel layer upon printed areas after processing and a dip in an electroless nickel bath. After processing on a silicon nitride coated poly-silicone substrate, a representative line of about 142 microns with a nickel layer has been demonstrated.

It is to be appreciated that embodiments of the formulations, methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A jettable etchant composition, comprising:
   8.3 to 11.4 mol/liter of an active ingredient, wherein the active ingredient comprises a first class active ingredient and a second class active ingredient, wherein the first active ingredient is selected from the group consisting of copper (II) sulfate, gold (I) chloride, gold (III) chloride, ammonium fluoride, nitric acid, sulfuric acid, nickel (II) chloride, iron (II) chloride, iron (III) chloride, zinc (II) chloride, potassium hydroxide, sodium hydroxide, and lithium hydroxide; and
   one or more of 10 to 90 wt % solvent, 0 to 10 wt % reducing agents, <1 to 20 wt % pickling agent, 0 to 5 wt % surfactant, and 0 to 5 wt % antifoam agent,
   wherein the active ingredient is capable of at least one of etching and doping a surface layer; and
   wherein the etchant composition is configured to be jettable and is configured to exhibit an inverse Ohnesorge number at 25° C. of between 1 and 10 at a printing orifice diameter between 20 and 60 µm.

2. The composition of claim 1, wherein the second class active ingredient is a palladium or nickel containing compound.

3. The composition of claim 2, wherein the second class active ingredient includes at least one of palladium (II) chloride, palladium (IV) chloride, palladium (II) acetate, trans-diamminedichloro-palladium(II), cis-diamminedichloro-palladium(II), tetraammine palladium hydrogen carbonate, tetraammine-palladium(II) chloride, sodium tetrachloropalladate(II), potassium tetrachloropalladate(II), palladium(II) nitrate, palladium(II) oxide, palladium(II) iodide, and diamminedinitropalladium(II).

4. The composition of claim 1, wherein the pickling agent is present in the composition at a concentration of 5 to 20 wt % and comprises a chemical or chemical mixtures which removes a metal passivation layer.

5. The composition of claim 4, wherein the pickling agent is selected from the group consisting of hydrochloric acid, sulfuric acid, nitric acid, phosphoric acid, and combinations of one or more of the foregoing.

6. The composition of claim 1, wherein the composition exhibits a surface tension of 30 to 40 dynes/cm.

7. The composition of claim 1, wherein the composition exhibits a viscosity of 7 to 15 cP at 40° C.

* * * * *